United States Patent
Wu et al.

(10) Patent No.: US 10,418,385 B2
(45) Date of Patent: Sep. 17, 2019

(54) ARRAY SUBSTRATE AND FABRICATION METHOD THEREOF, DISPLAY PANEL

(71) Applicants: Shanghai Tianma Micro-Electronics Co., Ltd., Shanghai (CN); Tianma Micro-Electronics Co., Ltd., Shenzhen (CN)

(72) Inventors: Tianyi Wu, Shanghai (CN); Jun Ma, Xiamen (CN); Tianqing Hu, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 16/018,956

(22) Filed: Jun. 26, 2018

(65) Prior Publication Data

US 2018/0308871 A1     Oct. 25, 2018

Related U.S. Application Data

(63) Continuation-in-part of application No. 15/475,223, filed on Mar. 31, 2017, now Pat. No. 10,038,015.

(30) Foreign Application Priority Data

Nov. 18, 2016 (CN) .......................... 2016 1 1025995

(51) Int. Cl.
*H01L 27/12*     (2006.01)
*H01L 29/786*     (2006.01)
(Continued)

(52) U.S. Cl.
CPC .......... *H01L 27/1225* (2013.01); *G09G 3/20* (2013.01); *G09G 3/3233* (2013.01);
(Continued)

(58) Field of Classification Search
CPC ............ H01L 27/1229; H01L 27/1237; H01L 27/1251; H01L 27/283; H01L 27/3274; H01L 27/1225
See application file for complete search history.

(56) References Cited

U.S. PATENT DOCUMENTS

2006/0246360 A1* 11/2006 Hwang ............... H01L 27/1214
                                                                                  430/5
2016/0063924 A1* 3/2016 Oh ...................... H01L 27/1229
                                                                                  345/690
(Continued)

FOREIGN PATENT DOCUMENTS

CN         1649152 A       8/2005
CN         1920934 A       2/2007
(Continued)

*Primary Examiner* — Changhyun Yi
(74) *Attorney, Agent, or Firm* — Anova Law Group, PLLC

(57) ABSTRACT

An array substrate, a display panel, and a fabrication method of the array-substrate are provided. The array substrate comprises a first thin film transistor including a first metal oxide thin film transistor and disposed in a display region, a second thin film transistor including an amorphous silicon thin film transistor and disposed in a peripheral circuit region; and a third thin film transistor including a second metal oxide thin film transistor and disposed in the peripheral circuit region. A first insulating layer is disposed between a first metal oxide semiconductor layer and a first gate electrode, and a second insulating layer is disposed above the first gate electrode, a second gate electrode, and the first metal oxide semiconductor layer. The amorphous silicon semiconductor layer, a first source electrode, a first drain electrode, a second source electrode, a second drain electrode are disposed above the second insulating layer.

20 Claims, 24 Drawing Sheets

(51) Int. Cl.
*H01L 29/423* (2006.01)
*H01L 29/417* (2006.01)
*G09G 3/20* (2006.01)
*G09G 3/3233* (2016.01)
*G09G 3/3258* (2016.01)
*G09G 3/3266* (2016.01)
*G11C 19/28* (2006.01)

(52) U.S. Cl.
CPC ......... *G09G 3/3258* (2013.01); *G09G 3/3266* (2013.01); *G11C 19/28* (2013.01); *H01L 27/127* (2013.01); *H01L 27/1288* (2013.01); *H01L 29/41733* (2013.01); *H01L 29/42384* (2013.01); *H01L 29/7869* (2013.01); *H01L 29/78663* (2013.01); *G02F 2201/123* (2013.01); *G09G 2300/0426* (2013.01); *G09G 2310/0286* (2013.01)

(56) References Cited

U.S. PATENT DOCUMENTS

| | | | |
|---|---|---|---|
| 2017/0098667 A1* | 4/2017 | Zhang | H01L 27/1229 |
| 2017/0184893 A1* | 6/2017 | Saitoh | G02F 1/1368 |
| 2017/0193947 A1 | 7/2017 | Kim et al. | |

FOREIGN PATENT DOCUMENTS

| | | |
|---|---|---|
| CN | 104538352 A | 4/2015 |
| CN | 104681491 A | 6/2015 |
| CN | 104778913 A | 7/2015 |
| CN | 204731755 U | 10/2015 |
| CN | 105390502 A | 3/2016 |
| CN | 106098699 A | 11/2016 |

* cited by examiner

ARRAY SUBSTRATE AND FABRICATION METHOD THEREOF, DISPLAY PANEL

CROSS-REFERENCES TO RELATED APPLICATIONS

This application is a continuation-in-part (CIP) application of U.S. patent application Ser. No. 15/475,223, filed on Mar. 31, 2017, which claims priority of Chinese Patent Application No. 201611025995.2, filed on Nov. 18, 2016, the entire contents of which are hereby incorporated by reference.

FIELD OF THE DISCLOSURE

The present disclosure generally relates to the field of display technology and, more particularly, relates to an array substrate and fabrication method thereof, and a display panel.

BACKGROUND

A metal oxide thin film transistor uses a metal oxide semiconductor layer as an active layer of the thin film transistor. Because of its optical properties such as a high carrier mobility, a low deposition temperature, and a high transparency, the metal oxide thin film transistor has become a prevailing display panel driving technology.

The display panels have relatively high requirements on the positive bias stability of the metal oxide thin film transistor disposed in the display region, and when the stability of the metal oxide thin film transistor in the display region is poor, display images may easily show issues such as residual images or uneven brightness of the display device. Accordingly, the positive bias stability of the metal oxide thin film transistor in the display region needs to be improved to enhance the display quality of the display panel.

Further, when the metal oxide tibia film transistor disposed m the non-display region of the display panel is an N-type thin film transistor, often a threshold voltage higher than or equal to a certain threshold voltage value (e.g., 3V) is needed to ensure that the thin film transistor is in an "off" state when the voltage between the gate and source electrodes of the metal oxide thin film transistor is zero.

However, according to the present disclosure, it is found that the greater the threshold voltage of the metal oxide thin film transistor, the poorer the positive bias stability. Accordingly, the metal oxide thin film transistor may not simultaneously satisfy the requirements of the display panel regarding the positive bias stability and the threshold voltage.

The disclosed array substrate and fabrication method thereof, and display panel are directed to solving at least partial problems set forth above and other problems.

BRIEF SUMMARY OF THE DISCLOSURE

One aspect of the present disclosure provides an army substrate. The array substrate comprises a first thin film transistor including a first metal oxide thin film transistor and disposed in a display region of the array substrate, wherein the first thin film transistor includes a First metal oxide semiconductor layer, a first gate electrode, a first source electrode and a first drain electrode; a second thin film transistor including an amorphous silicon thin film transistor and disposed in a peripheral circuit region of the array substrate, wherein the second thin film transistor includes an amorphous silicon semiconductor layer, a second gate electrode, a second source electrode and a second drain electrode; and a third thin film transistor including a second metal oxide thin film transistor and disposed in the peripheral circuit region of the array substrate. The first thin film transistor, the second thin film transistor and the third thin film transistor are disposed above a substrate. A first insulating layer is disposed between the first metal oxide semiconductor layer and the first gate electrode, and a second insulating layer is disposed above the first gate electrode, the second gate electrode, the first metal oxide semiconductor layer, and the substrate. The amorphous silicon semiconductor layer, the first source electrode, the first drain electrode, the second source electrode, and the second drain electrode are disposed above the second insulating layer.

Another aspect of the present disclosure provides a display panel including an array substrate. The array substrate comprises a first thin film transistor including a first metal oxide thin film transistor and disposed in a display region of the array substrate, wherein the first thin film transistor includes a first metal oxide semiconductor layer, a first gate electrode, a first source electrode and a first drain electrode; a second thin film transistor including an amorphous silicon thin film transistor and disposed in a peripheral circuit region of the array substrate, wherein the second thin film transistor includes an amorphous silicon semiconductor layer, a second gate electrode, a second source electrode and a second drain electrode; and a third thin film transistor including a second metal oxide thin film transistor and disposed in the peripheral circuit region of the array substrate. The first thin film transistor, the second thin film transistor and the third thin film transistor are disposed above a substrate. A first insulating layer is disposed between the first metal oxide semiconductor layer and the first gate electrode, and a second insulating layer is disposed above the first gate electrode, the second gate electrode, the first metal oxide semi conductor layer, and the substrate. The amorphous silicon semiconductor layer, the first source electrode, the first drain electrode, the second source electrode, and the second drain electrode are disposed above the second insulating layer.

Another aspect of the present disclosure provides an array substrate fabrication method. The array substrate fabrication method comprises; forming a first thin film transistor, a second thin film transistor-and a third thin film transistor above a substrate. Both the first thin film transistor and the third thin film transistor are metal oxide thin film transistors, and the second thin film transistor is an amorphous silicon thin film transistor. The first thin film transistor is disposed in a display region of the array substrate, and both the second thin film transistor and the third thin film transistor are disposed in a peripheral circuit region of the array substrate.

Other aspects of the present disclosure can be understood by those skilled in the art in light of the description, the claims, and the drawings of the present disclosure.

BRIEF DESCRIPTION OF THE DRAWINGS

Other features, goals, and advantages of the present disclosure will become more apparent via a reading of detailed descriptions of non-limiting embodiments with reference to the accompanying drawings.

DETAILED DESCRIPTION

Figure 1:
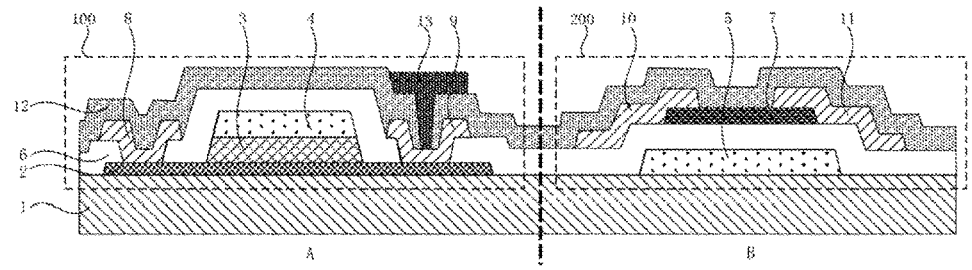
FIG. 1 illustrates a cross-sectional schematic view of an exemplary array substrate according to embodiments of the present disclosure.

Reference will be made in detail with reference to embodiments of the present disclosure as illustrated in the accompanying drawings and embodiments. It should be understood that, specific embodiments described herein are only for illustrative purposes, and are not intended to limit the scope of the present disclosure. In addition, for ease of description, accompanying drawings only illustrate a part of, but not entire structure related to the present disclosure.

As discussed above, a greater threshold voltage of the metal oxide thin film transistor often accompanies a poorer positive bias stability. Accordingly, the metal oxide thin film transistor often cannot simultaneously satisfy the requirements of a display panel regarding the positive bias stability and the threshold voltage.

Directed to solving at least partial problems set forth above and other problems, the present disclosure provides an improved array substrate including a first thin film transistor and a second thin film transistor. The first thin film transistor and the second thin film transistor are disposed above a substrate. The first thin film transistor includes a metal oxide thin film transistor, and the second thin film transistor includes an amorphous silicon thin film transistor. The first thin film transistor is disposed in a display region of the array substrate, and the second thin film transistor is located in a peripheral circuit region of the array substrate.

The metal oxide thin trim transistor has advantages such as relatively high carrier mobility, uniform electrical performances, being transparent to visible light, a low processing temperature, and potential of scalable fabrication, etc. By applying the metal oxide thin film transistor to the display region of the array substrate, the pixel density, the aperture ratio, and the brightness: of the display region may be effectively improved. Further, by improving the stability of the metal oxide thin film transistor, the display quality of the display panel may be improved, thereby avoiding occurrence of issues such as residual images or uneven brightness, etc.

The amorphous silicon thin film transistor is characterized by having a low cut-off current. That is, only a relatively low threshold voltage is needed to ensure that the voltage between the gate electrode and the source electrode of the amorphous silicon thin film transistor is zero, such that the amorphous silicon thin film transistor in a peripheral circuit of the array substrate may be in an "off" state to ensure normal operation of the peripheral circuit region of the array substrate.

By using a metal oxide thin film transistor in the display region of the array substrate and using an amorphous silicon thin film transistor in the peripheral circuit region of the array substrate, embodiments of the present disclosure may solve issue that the metal oxide thin film transistor cannot simultaneously satisfy the requirements of the display panel regarding the positive bias stability and the threshold voltage. Accordingly, the image display effect may be improved, and the stability and yield of the peripheral circuit region may be improved.

Optionally, the peripheral circuit region of the array substrate may include a vertical shift register (VSR), and a scanning signal may be provided to each row of pixels in the display region via the VSR. By disposing VSR in the peripheral circuit region of the array substrate, the number of peripheral driving chips and the number of corresponding connection lines may be reduced, the design space of layout wiring may be saved, and the fabrication cost of the display panel may be decreased. In particular, VSR may include a plurality of second thin film transistors. The plurality of second thin film transistors in the VSR may form a plurality of cascaded shift registers. Each shift register may be connected to a corresponding scanning line and control the on-and-off of the first thin film transistors connected to the scanning line, thereby realizing scanning of each pixel in the display panel row by row.

Technical solutions in embodiments of the present disclosure, will be described hereinafter with reference to the accompanying drawings as illustrated in embodiments of the present disclosure. Based on the embodiments of the present disclosure, other embodiments obtainable by those ordinarily skilled in the relevant art without creative effort shall all fall within the protection scope of the present disclosure.

FIG. 1 illustrates a cross-sectional schematic view of an exemplary array substrate according to embodiments of the present disclosure. As shown, in FIG. 1, the array substrate may include a first thin film transistor 100 disposed in a display region A of the array substrate, and a second thin film transistor 200 disposed in a peripheral circuit region B of the array substrate. The first thin film transistor 100 may be a metal oxide thin film transistor, and the second thin film transistor 200 may be an amorphous silicon thin film transistor.

More specifically, the array substrate may include a substrate 1, a metal oxide semiconductor layer 2, an insulating layer 3, a first gate electrode 4, a second gate electrode 5, a second insulating layer 6, an amorphous silicon semiconductor layer 7, a first source electrode 8, a first drain electrode 9, a second source electrode 10, a second drain electrode 11, a third insulating layer 12, and a pixel electrode 13.

For example, the metal oxide semiconductor layer 2 may be disposed above the substrate 1 and located in a display region A of the array substrate. The first insulating layer 3 may be disposed above the metal oxide semiconductor layer 2. The first gate electrode 4 may be disposed above the first insulating layer 3 and located in the display region A of the array substrate.

Further, the second gate electrode 5 may be disposed above the substrate 1 and be located in a peripheral circuit region B of the array substrate. The second insulating layer 6 may be disposed above the first gate electrode 4, the second gate electrode 5, the metal oxide semiconductor layer 2, and the substrate 1. The amorphous silicon semiconductor layer 7 may be disposed above the second insulating layer 6 and be located in the peripheral circuit region 8 of the array substrate.

Further, the first source electrode 8, the first drain electrode 9, the second source electrode 10, and the second drain electrode 11 may be disposed above the second insulating layer 6. A first through-hole may be formed in a region of the second insulating layer 6 corresponding to the metal oxide semiconductor layer. The first source electrode of and the first drain electrode 9 may be connected to the metal oxide semiconductor layer 2 via the first through-hole, and the second source 10 and the second drain electrode 11 may be connected to the amorphous silicon semiconductor layer 7.

Further, the third insulating layer 12 may be disposed above the first source electrode 8, the first drain electrode 9, the second source electrode 10, the second drain electrode 11, and the second insulating-layer 6. A second through-hole may be formed in a region of the third insulating layer 12 corresponding to first drain electrode 9. The pixel electrode 13 may be disposed above the third insulating 12, and the pixel electrode 13 may be connected to the first drain electrode 9 via the second through-hole.

Accordingly, the first thin film transistor 100 (e.g., the metal oxide thin film transistor) in the display region A of die array substrate may be a top-gate structure. That is, the first gate electrode 4 may be disposed above the metal oxide semiconductor layer 2. Further, the second thin film transistor 200 (e.g., the amorphous silicon thin film transistor) disposed in the peripheral circuit region B of the array substrate may be a bottom-gate structure. That is, the second gate electrode 5 may be disposed below the amorphous silicon semiconductor layer 7.

Further, the first gate electrode 4 of the first thin film transistor 100 (e.g., the metal oxide thin film transistor) may receive a scanning signal transmitted by a scanning line, and the first source electrode 8 may receive a data signal transmitted by a data line, thereby providing a working voltage to the pixel electrode 13.

Figure 10:
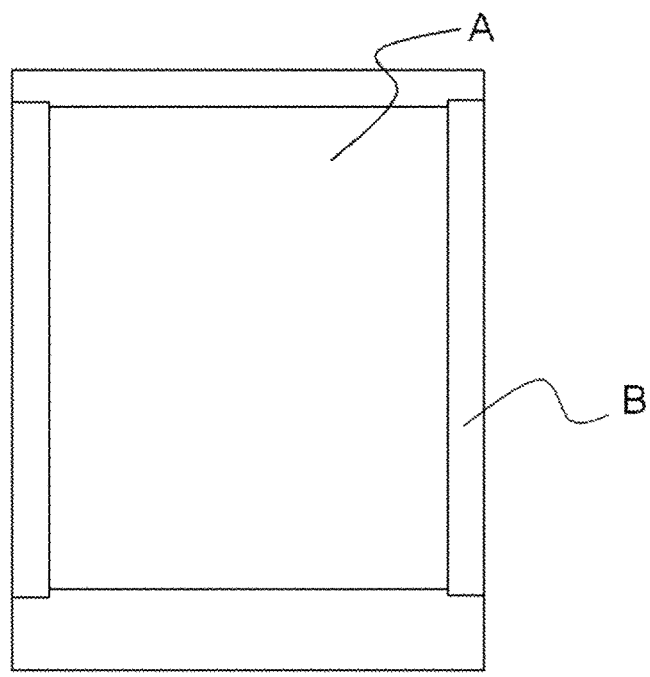
FIG. 10 illustrates a top view of an exemplary array substrate showing positions of a display region and a peripheral circuit region according to embodiments of the present disclosure.

FIG. 10 illustrates a top view of an exemplary array substrate showing positions of a display region A and a peripheral circuit region B according to embodiments of the present disclosure. As shown in FIG. 10, the array substrate may include a display region A and a non-display region surrounding the display region A. The non-display region may further include a peripheral circuit region B. For example, the peripheral circuit region B may be located on two sides of the display region A. Further, the peripheral circuit region B may include a vertical shift register (VSR), and the VSR may include a plurality of second thin film transistors (e.g., the amorphous silicon thin film transistor).

Figure 2:
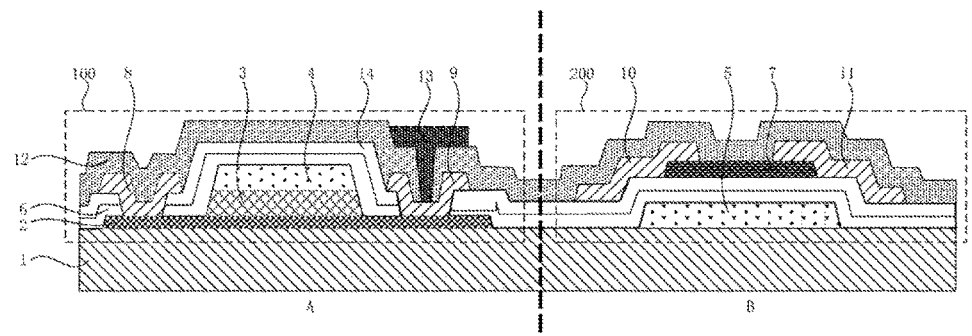
FIG. 2 illustrates a cross-sectional schematic view of another exemplary array substrate according to embodiments of the present disclosure.

FIG. 2 illustrates a cross-sectional schematic view of another exemplary array substrate according to embodiments of the present disclosure. Different from aforementioned embodiments, the array substrate illustrated in FIG. 2 may further include a fourth insulating layer 14.

In particular, the fourth insulating layer 14 may be disposed above the second insulating layer 6, and the fourth insulating layer 14 and the amorphous silicon semiconductor layer 7 may be formed continuously in a same chamber. Accordingly, the change of the fabrication chamber and the transmission of the sample may be avoided, the fabrication processes of the array substrate may be effectively simplified, and the fabrication period may be shortened, thereby improving a fabrication efficiency of the array substrate.

Optionally, a material of the second insulating layer 6 may be $SiO_2$ or $SiN_x$. Optionally, the material of the second insulating layer 6 maybe $SiO_2$, and a material of the fourth insulating layer 14 may be $SiN_x$. The second insulating layer 6 may be made of $SiO_2$ and contact the metal oxide semiconductor layer 2, thereby avoiding impact of an insulating layer with a relatively high hydrogen content (e.g., $SiN_x$) on the electrical performance of the metal oxide semiconductor layer 2 in a fabrication process. The fourth insulating layer 14 may be made of $SiN_x$ and contact the amorphous silicon semiconductor layer 7. The fourth insulating layer 14 may be further used as a buffer passivation layer for the amorphous silicon semiconductor layer 7, thereby improving the film quality of the amorphous silicon semiconductor layer 7.

Optionally, a material of the first insulating layer 3 may be $SiO_2$, and a material of the third insulating layer 12 may be at least one of $SiO_2$ and $SiN_x$. The first insulating layer 3 may be made of $SiO_2$ and contact the metal oxide semiconductor layer 2, thereby avoiding the impact of the insulating layer with a relatively high hydrogen content (e.g., $SiN_x$) on the electrical performance of the metal oxide semiconductor layer 2. The third insulating layer 12 may be made of a stacking structure formed by $SiO_2$, or $SiN_x$, or a combination thereof, and contact the amorphous silicon semiconductor layer 7, and the third insulating layer 12 maybe used as a buffer passivation layer of the amorphous silicon semiconductor layer 7, thereby improving the film quality of the amorphous silicon semiconductor layer 7.

Optionally, an active layer of the metal oxide thin film transistor (i.e., the metal oxide semiconductor layer 2 in FIG. 1 and FIG. 2) may be made a metal oxide formed by one or more elements selected from Zn, Ga, In, So, Al, HF, C, B, M and S. For example, the active layer of the metal oxide thin film transistor may be made of Indium Gallim Zinc Oxide (IGZO). More specifically, the IGZO may be an amorphous oxide comprising indium, gallim, and zinc.

Further, the carrier mobility of IGZO may be relatively high, thereby improving a charge-discharge rate of the metal oxide thin film transistor towards the pixel electrode. A response rate of the pixels may be improved, thereby increasing the scanning rate of the pixels. Accordingly, the implementation of an ultra-high resolution may become possible. The active layer of the metal oxide thin film transistor may be, for example, formed by a method such as magnetron sputtering, etc. The present disclosure is not intended to limit the fabrication processing of the active layer of the metal oxide thin film transistor.

Figure 3:
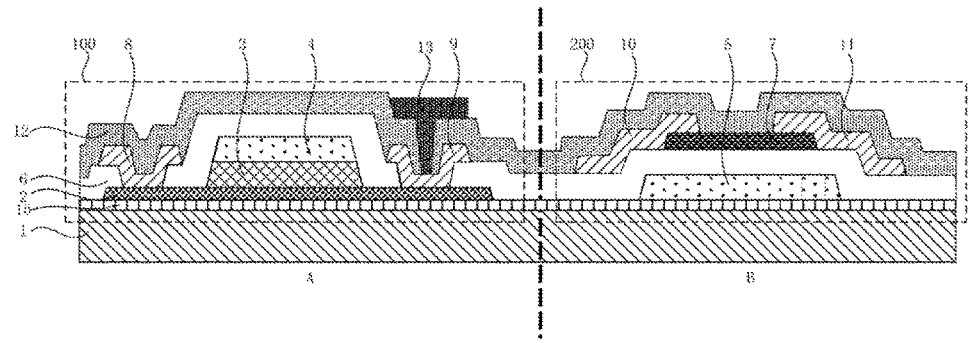
FIG. 3 illustrates a cross-sectional schematic view of another exemplary array substrate according to embodiments of the present disclosure.

FIG. 3 illustrates a cross-sectional schematic view of another exemplary array substrate according to embodiments of the present disclosure. Different from aforementioned embodiments, the array substrate illustrated in FIG. 3 may further include a buffer layer 15. In particular, the buffer layer 15 may be sandwiched between the metal oxide semiconductor layer 2 and the substrate 1, and between the second gate electrode 5 and the substrate 1. The buffer layer 15 may improve the film quality of the metal oxide semiconductor layer 2 and the gate electrode 5. For example, the buffer layer 15 may be formed by stacking of the $SiO_2$ thin films and the $SiN_x$ thin films. In particular, the $SiN_x$ thin film may be configured to contact the metal oxide semiconductor layer 2.

Optionally, if the disclosed array substrate is applied in an organic light-emitting display panel, the display region of the array substrate provided by embodiments of the present disclosure may include a plurality of pixel driving circuits. A pixel driving circuit may include at least two first thin film transistors and at least one capacitor. For example, FIG. 4 illustrates a structural schematic view of an exemplary pixel driving circuit according to embodiments of the present disclosure.

Figure 4:
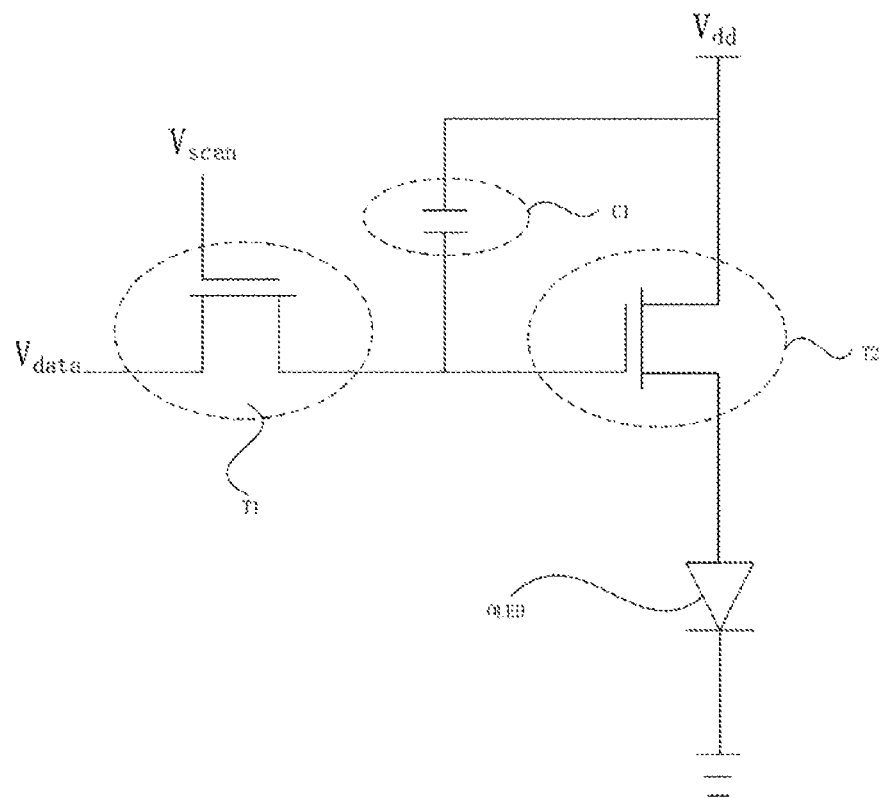
FIG. 4 illustrates a structural schematic view of an exemplary pixel driving circuit according to embodiments of the present disclosure.

As shown in FIG. 4, the pixel driving circuit may include two first thin film transistors and one capacitor. In particular, a first gate electrode of the first thin film transistor T1 may be connected to a scanning line $V_{scan}$, a first source electrode of the first thin film transistor T1 may be connected to a first gate electrode of another first thin film transistor T2, and a drain electrode of the first thin film transistor T1 may be connected to a data line $V_{data}$.

Further, a first electrode of the capacitor C1 may be connected to a first gate electrode of the first thin film transistor T2 and the first source electrode of the first thin film transistor T1, and a second electrode of the capacitor C1 may be connected to the first drain electrode of the first thin film transistor T2 and a working power source end $V_{dd}$. A first source electrode of the first thin film transistor T2 may be connected to an anode of an organic light-emitting display (OLED) panel.

Specifically, when the scanning line is selected, the first thin film transistor T1 may be turned on, the data voltage may charge the capacitor C1 via the first thin film transistor T1, and the voltage of the capacitor C1 may control a drain electrode current of the first thin film transistor 12. When the scanning line is not selected, the first thin film transistor T1 may be turned off, the electrical charges stored in the capacitor C1 may maintain a gate electrode voltage of the first thin film transistor T2. Accordingly, the first thin film transistor T2 may remain an "on" state, such that the OLED may be in a state controlled by a constant current.

FIG. 4 only illustrates a structural schematic view of a pixel driving circuit comprising two first thin film transistors and one capacitor. The present disclosure is, however, not intended to limit the number of the first thin film transistors and the number of capacitors included in the pixel driving circuit. For example, the pixel driving circuit of the array substrate may include three first thin film transistors and one capacitor.

Figure 5:
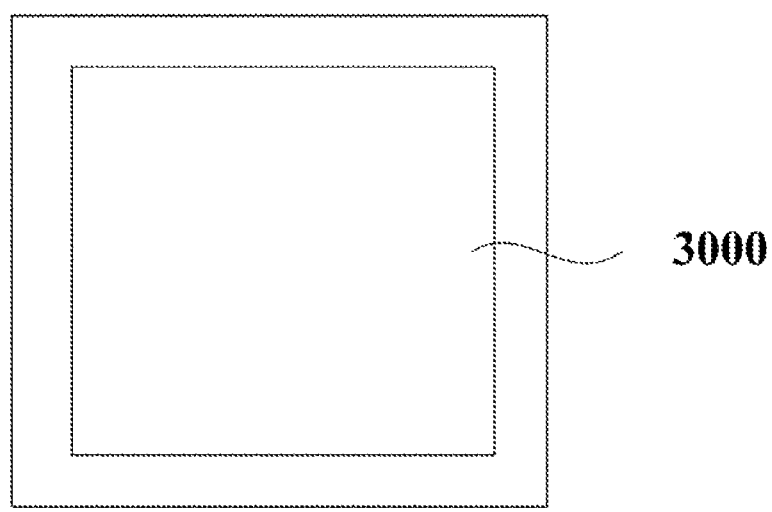
FIG. 5 illustrates a structural schematic view of an exemplary display panel according to embodiments of the present disclosure.

The present disclosure also provides a display panel. FIG. 5 illustrates a structural schematic view of an exemplary display panel according to embodiments of the present disclosure. As shown in FIG. 5, the display panel may include an array substrate 3000 according to the aforementioned embodiments.

Because the disclosed display panel includes an array substrate illustrated in the aforementioned embodiments, the disclosed display panel may have beneficial effects described in the aforementioned embodiments, which are not described herein. For example, the disclosed display panel may be a liquid crystal display panel, or an organic light-emitting display panel OLED. Further, the organic light-emitting display panel may be applied to any product or component having a display function, such as a notebook, a tablet, or a display device, etc.

Further, the present disclosure also provides a fabrication method of an array substrate, and the method may include forming a first thin film transistor and a second thin film transistor above a substrate. The first thin film transistor may be a metal oxide thin film transistor, and the second thin film transistor may be an amorphous silicon thin film transistor. The first thin film transistor may be disposed in a display region of the array substrate, and the second thin film transistor may be disposed in a peripheral circuit region of the array substrate.

By disposing the metal oxide thin film transistor in the display region of the array substrate and disposing the amorphous silicon thin film transistor in the peripheral circuit region of the array substrate, the present disclosure may solve issues that the metal oxide thin film transistor cannot satisfy requirements of the display panel regarding the positive bias stability and the threshold voltage. Thus, the image display effect may be improved, and the stability and yield of the peripheral circuit region may be improved.

Figure 6:
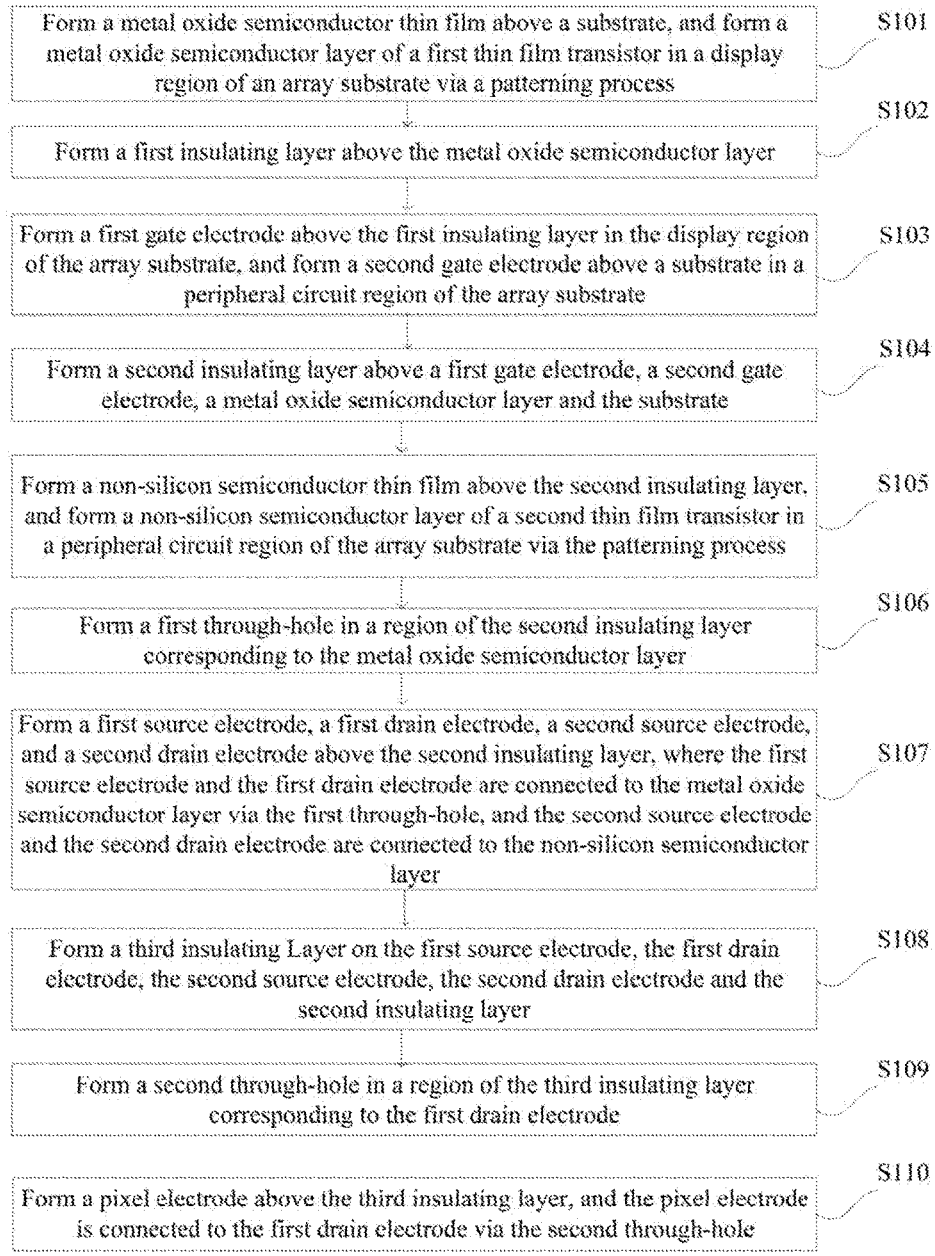
FIG. 6 illustrates a flow chart of an exemplary fabrication method of an array substrate according to embodiments of the present disclosure.

FIG. 6 illustrates a flow chart of an exemplary fabrication method of an array substrate according to embodiments of the present disclosure. FIG. 7A-FIG. 7J illustrate cross-sectional schematic views of each step in FIG. 6. As shown in FIG. 6, the method may include the following steps.

Step S101: forming a metal oxide semiconductor thin film above a substrate, and forming a metal oxide semiconductor layer of a first thin film transistor in a display region of the array substrate via a patterning process.

Figure 7A:
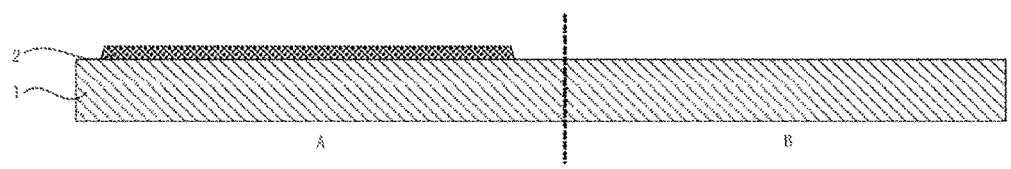
FIG. 7A-FIG. 7J illustrate cross-sectional schematic views of each step in FIG. 6.

For example, a metal oxide semiconductor thin film may be disposed above the substrate via a method, such as a physical or chemical vapor deposition (CVD). A patterning process may be performed on the metal oxide semiconductor, including, for example, spin-coating of a photo-resist, exposure, developing, and etching. Referring to FIG. 7A, a metal oxide semiconductor layer 2 may be formed above the substrate 1 in the display region A of the array substrate. The material of the metal oxide semiconductor layer 2 may be, for example, IGZO.

Step S102: forming a first semiconductor layer above the metal oxide semiconductor layer.

Figure 7B:
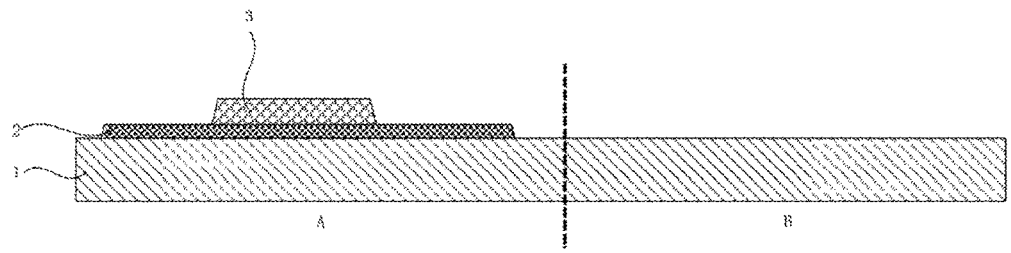

Referring to FIG. 7B, a first insulating layer 3 may be disposed above the metal oxide semiconductor layer 2. The first insulating layer 3 may be made of a material such as $SiO_2$. Optionally, a plasma enhanced chemical vapor deposition method may be used to fabricate the first insulating layer 3, and the fabrication temperature may be configured to be lower than 220° C. The plasma enhanced chemical vapor deposition needs a relatively low deposition, thereby having a relatively small effect on the structure and physical properties of a film layer. Accordingly, the thickness and composition of the formed film layer may be relatively uniform, the film layer may be relatively dense, and the adhesion may be strong.

Step S103: forming a first gate electrode above the first insulting layer in the display region of the array substrate, and forming a second gate electrode above the substrate in a peripheral circuit region of the array substrate.

Figure 7C:
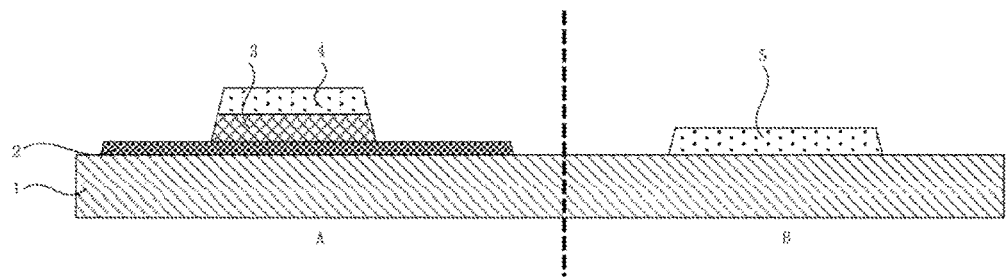

Referring to FIG. 7C, for example, a layer of gate electrode metal material may be disposed above the first insulating layer 3 in the display region A of the array substrate and on the substrate 1 in the peripheral circuit region B of the array substrate via a method of sputtering or evaporation. A patterning process may be performed on the gate electrode metal material to form a first gate electrode 4 and a second gate electrode 5.

Step S104: forming a second insulating layer on the first gate electrode, the second gate electrode, the metal oxide semiconductor layer, and the substrate.

Figure 7D:
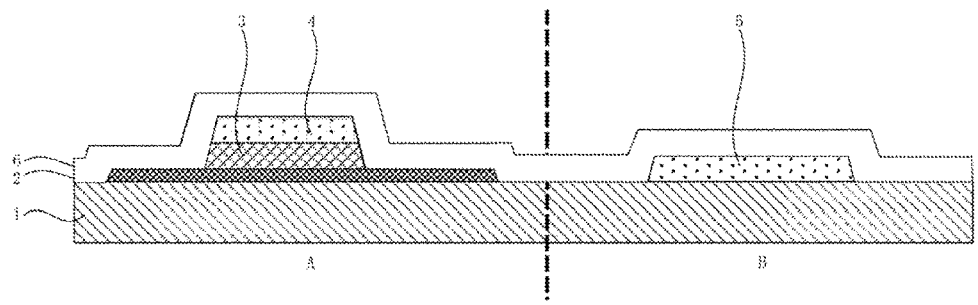

Referring to FIG. 7D, a second insulating layer 6 may be disposed above the first gate electrode 4, the second gate electrode 5, the metal oxide semiconductor layer 2, and the substrate 1. The material of the second insulating layer 6 may be, for example, $SiO_2$ or $SiN_x$. Optionally, a plasma enhanced chemical vapor deposition (PECVD) method may be applied to form the second insulating layer 6, and the fabrication temperature may be lower than or equal to 220° C.

Step S105: forming an amorphous silicon semiconductor thin film above the second insulating layer, and forming an amorphous silicon semiconductor layer of a second thin film transistor in the peripheral circuit region of an army substrate via a patterning process.

Figure 7E:
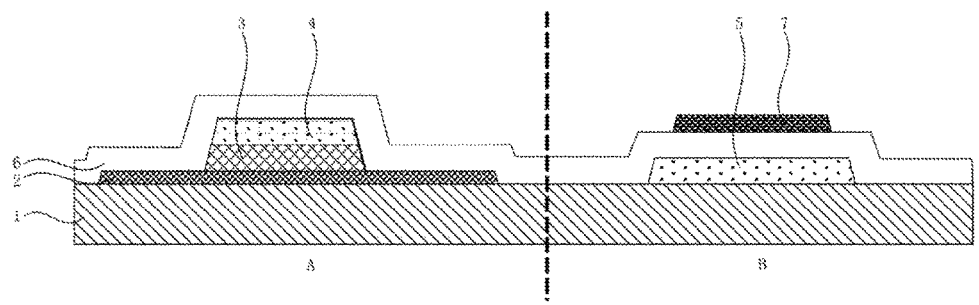

Referring to FIG. 7E, an amorphous silicon, semiconductor thin film 7 may be disposed above the second insulating layer 6. A patterning process may be performed on the amorphous silicon semiconductor thin film 7, such that an amorphous silicon semiconductor thin film pattern (i.e., the amorphous silicon semiconductor layer 7) may be formed on the second insulating layer 6 in the peripheral circuit region of the array substrate. Optionally, the present disclosure may form an amorphous silicon semiconductor thin film via a plasma enhanced chemical vapor deposition method, and the fabrication temperature may be configured to be lower than or equal to 300° C.

Because the amorphous silicon, semiconductor thin film is made of amorphous silicon, when the fabrication temperature increases, the crystallization degree of the amorphous silicon semiconductor and the mobility may be increased. However, an excess temperature may easily affect the electrical performance of the formed metal oxide semiconductor layer. Thus, the fabrication temperature of the amorphous silicon semiconductor thin film may be selected to be lower than or equal to 300° C.

Step S106: forming a first through-hole in a region of the second insulating layer corresponding to the metal oxide semiconductor layer.

Figure 7F:
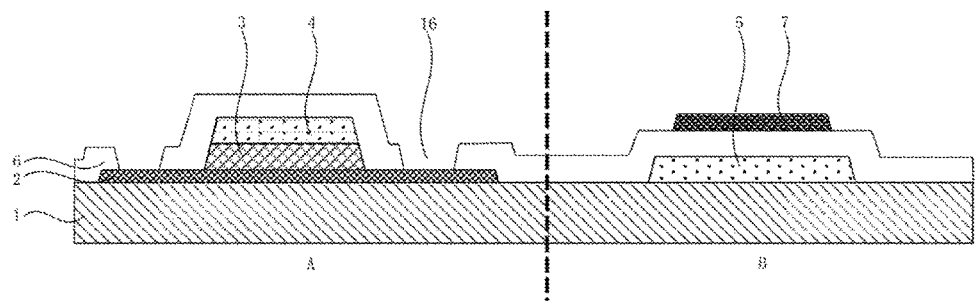

Referring to FIG. 7F, a first through-hole 16 may be formed in the region of the second insulating layer 6 corresponding to the metal oxide semiconductor layer 2. For example, the first through-hole 16 may be formed by using a mask plate via a photo-etching method.

Step S107: forming a first source electrode, a first drain, electrode, a second source electrode, and a second drain electrode above the second insulating layer, where the first source electrode and the first drain electrode are connected to the metal oxide semiconductor layer via the first through-hole, and the second source electrode and the second drain electrode are connected to the amorphous silicon semiconductor layer.

Figure 7G:
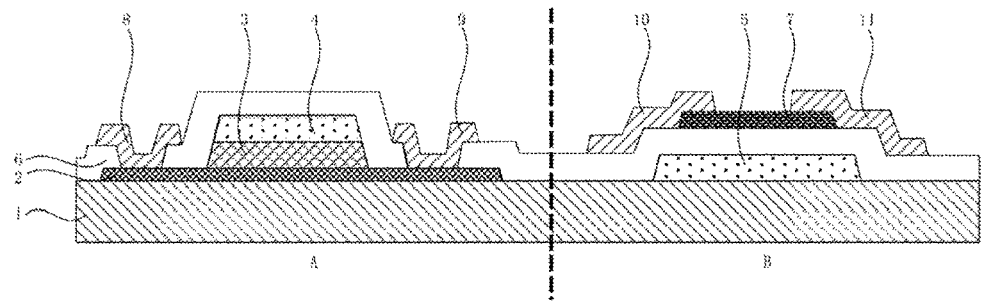

Referring to FIG. 7G, a first source electrode 8, a first drain electrode 9, a second source electrode 10, and a second drain electrode 11 may be disposed above the second insulating layer 6. In particular, the first source electrode 8 and the first drain electrode 9 may be connected to the metal oxide semiconductor layer 1 via the first through-hole, and the second source electrode 10 and the second drain electrode 11 may be connected to the amorphous silicon semiconductor layer 7.

Step S108: forming a third insulating layer above the first source electrode, the first drain electrode, the second source electrode, the second drain electrode, and the second insulating layer.

Figure 7H:
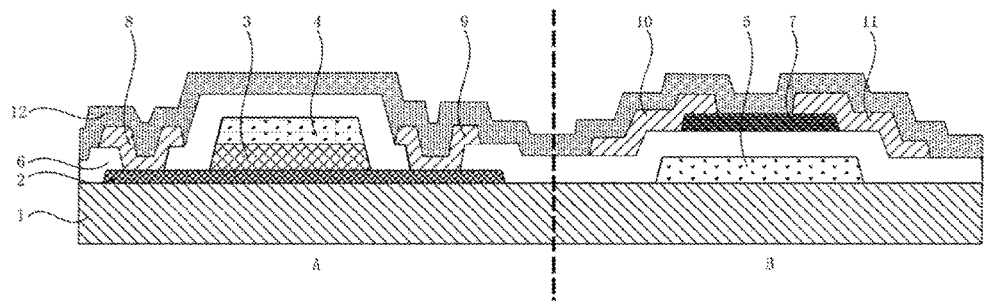

Referring to FIG. 7H, a third insulating layer 12 may be disposed above the first source electrode 8, the first drain electrode 9, the second source electrode 10, the second drain electrode 11, and the second insulating layer 6. A material of the third insulating layer 12 may be, for example, made of $SiO_2$, $SiN_x$, or a sucking structure formed $SiO_2$ and $SiN_x$. Optionally, the third insulating layer 12 may be formed via a plasma enhanced chemical vapor deposition method, and the fabrication temperature may be configured to be lower than or equal to 300° C.

Step S109: forming a second through-hole in a region of the third insulating layer corresponding to the first drain electrode.

Figure 7I:
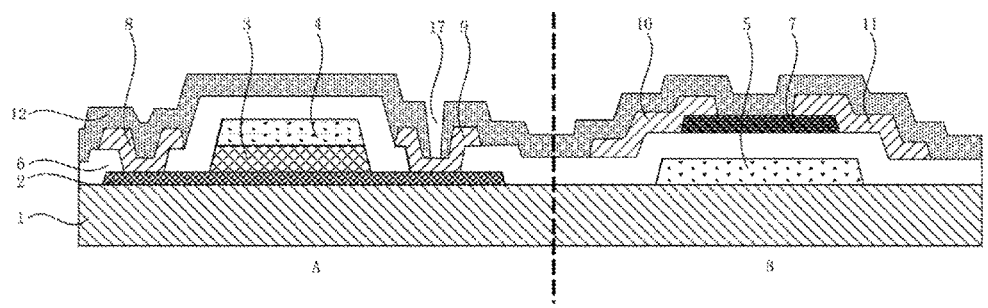

Referring to FIG. 7I, a second through-hole 17 may be formed in a region of the third insulating layer 12 corresponding to the first drain electrode 9. For example, the second through-hole 17 may be formed using a mask plate via a photo-etching method.

Step S110: forming a pixel electrode above the third insulating layer, where the pixel electrode is connected to the first drain electrode via the second through-hole.

Figure 7J:
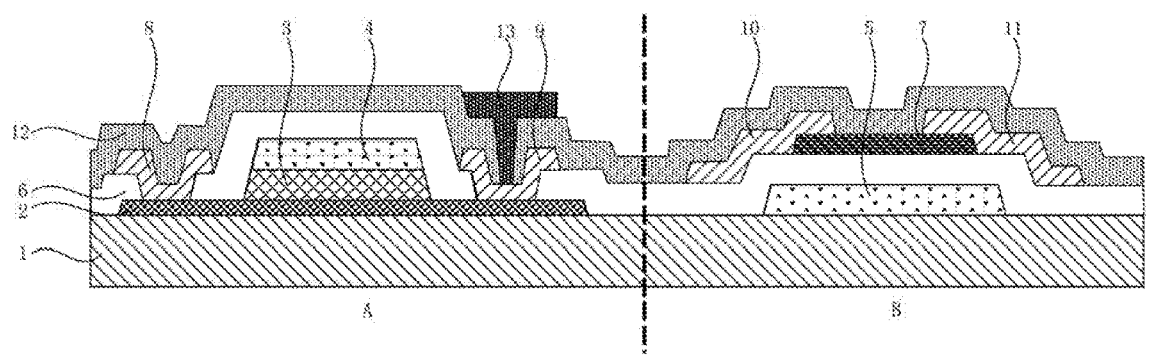

Referring to FIG. 7J, a pixel electrode 13 may be disposed above the third insulating layer 12, and the pixel electrode 13 may be connected to the first drain electrode 9 via a second through-hole.

Figure 8:
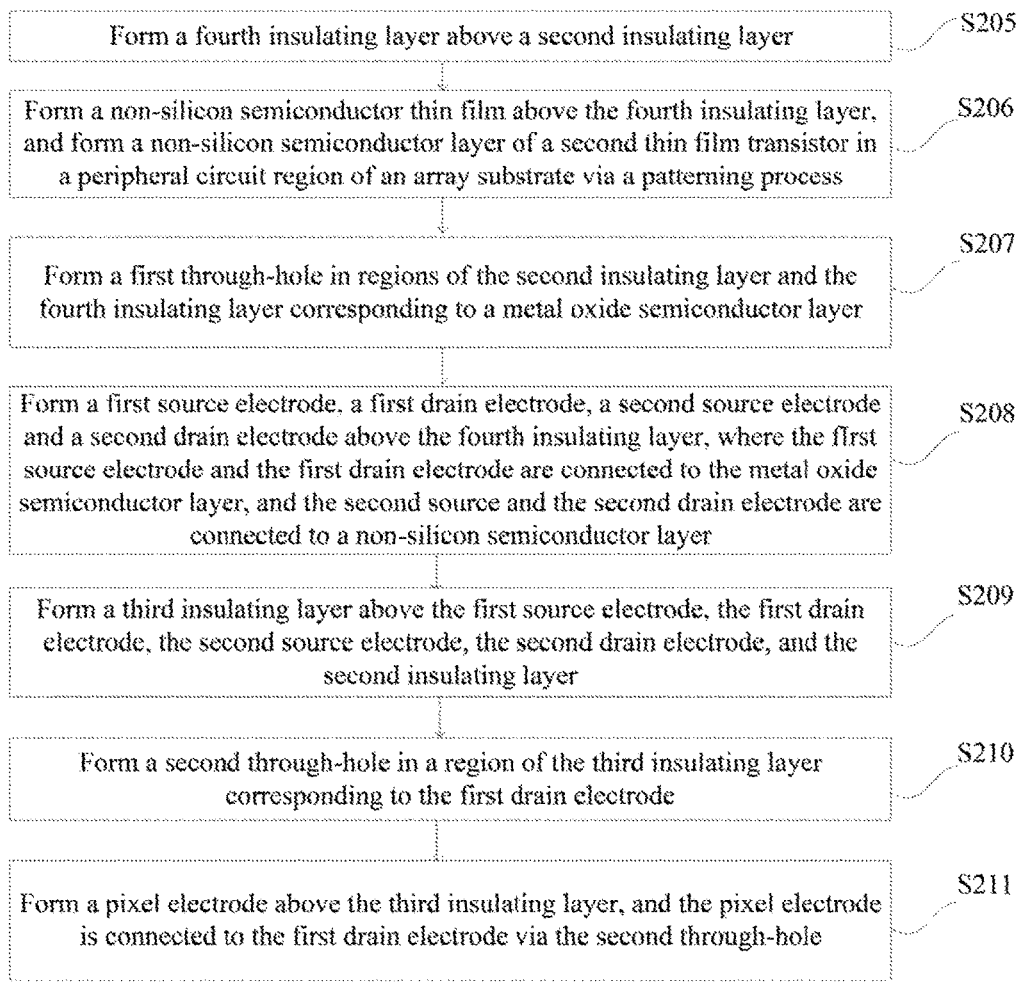
FIG. 8 illustrates a flow chart of Step 205-Step 211 in another exemplary fabrication method of an array substrate according to embodiments of the present disclosure.

In another embodiment, FIG. 8 illustrates a flow chart of Step 205-Step 211 in another exemplary fabrication method of an array substrate according to embodiments of the present disclosure. FIG. 9A-FIG. 9G illustrate cross-sectional views of each step in FIG. 8 according to embodiments of the present disclosure. Based on the aforementioned embodiments, the disclosed fabrication method of an array substrate may include the following steps.

Step S201: forming a metal oxide semiconductor thin film above a substrate, and forming a metal oxide semiconductor layer of a first thin film transistor in a display region of an array substrate via a patterning process.

Step S202: forming a first insulating layer above the metal oxide semiconductor layer.

Step S203: forming a first gate electrode above the first insulating layer in the display region of the array substrate, and forming a second, gate electrode above the substrate in a peripheral circuit region of the array substrate.

Step S204: forming a second insulating layer above the first gate electrode, the second gate electrode, the metal oxide semiconductor layer, and the substrate.

The cross-sectional schematic views in Step S201-Step S204 may be similar to the cross-sectional schematic views illustrated in Step S101-Step S104, which are not repeatedly provided herein. The fabrication method of an array substrate may further include the following steps.

Step S205: forming a fourth insulating layer above the second insulating layer.

Figure 9A:
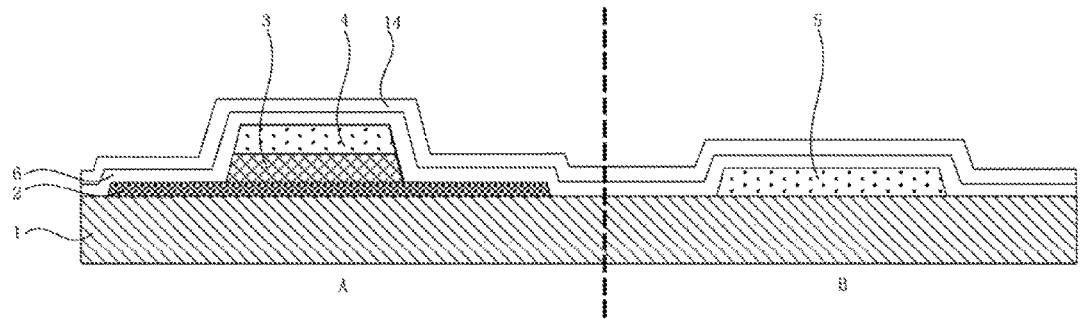
FIG. 9A-FIG. 9G illustrate cross-sectional views of each step in FIG. 8 according to embodiments of the present disclosure.

Referring to FIG. 9A, a fourth insulating layer 14 may be disposed above the second insulating layer 6. A material of the fourth insulating layer may be $SiN_x$. Optionally, the fourth insulating layer may be formed using a method of plasma enhanced chemical vapor deposition, and a fabrication temperature may be lower than or equal to 300° C.

Step S206: forming an amorphous silicon semiconductor thin film above the fourth insulating layer, and forming an amorphous silicon semiconductor layer of a second thin film transistor in the peripheral circuit region of the array substrate via a patterning process.

Figure 9B:
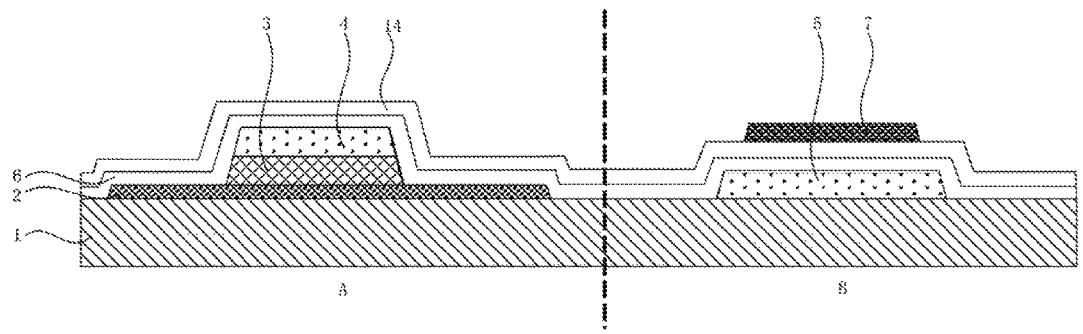

Referring to FIG. 9B, an amorphous silicon semiconductor thin film may be disposed above the fourth insulating layer 14, and via a patterning process, an amorphous silicon semiconductor layer 7 of a second thin film transistor may be formed in the peripheral circuit region B of the array substrate. Optionally, the amorphous silicon semiconductor thin film may be formed using a method of plasma enhanced chemical vapor deposition, and the fabrication temperature may be lower than or equal to 300° C.

For example, the amorphous silicon semiconductor thin film and the fourth insulating layer 14 may be formed in the same chamber, such that the change of the fabrication chamber and the transmission of the sample may be avoided. Further, the fabrication process of the array substrate may be effectively simplified, and the fabrication period may be shortened, thereby improving the fabrication efficiency of the array substrate.

Step S207: forming a first through-hole in a region of the second insulating layer and the fourth insulating layer corresponding to the metal oxide semiconductor layer.

Figure 9C:
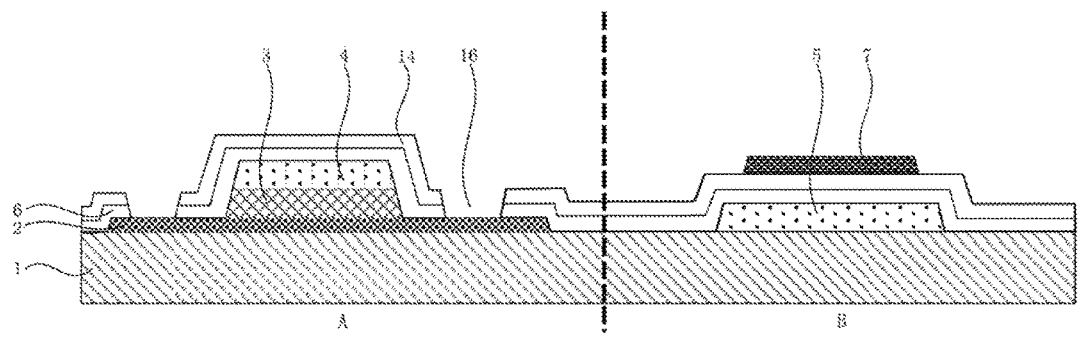

Referring to FIG. 9C, a first through-hole 16 may be formed in a region of the second insulating layer 6 and the fourth insulating layer 14 corresponding to the metal oxide semiconductor layer 2. For example, the first through-hole 16 may be formed using a mask plate via a photo-etching method.

Step S208, forming a first source electrode, a first drain electrode, a second source electrode, and a second drain electrode above the fourth insulating layer, where the first source electrode and the first drain electrode are connected to the metal oxide semiconductor layer via the first through-hole, and the second source electrode and the second drain electrode are connected to the amorphous silicon semiconductor layer.

Figure 9D:
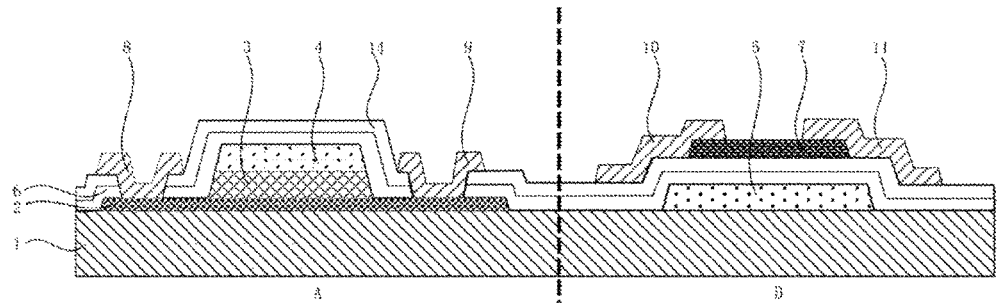

Referring to FIG. 9D, a first source electrode 8, a first drain electrode 9, a second source electrode 10, and a second drain electrode 11 may be disposed above the fourth insulating layer. In particular, the first source electrode 8 and the first drain electrode 9 may be connected to the metal oxide semiconductor layer 2 via the first through-hole, and the second source electrode 10 and the second drain electrode 11 may be connected to the amorphous silicon semiconductor layer.

Step S209, forming a third insulating layer above the first source electrode, the first drain electrode, the second source electrode, the second drain electrode, and the second insulating layer.

Figure 9E:
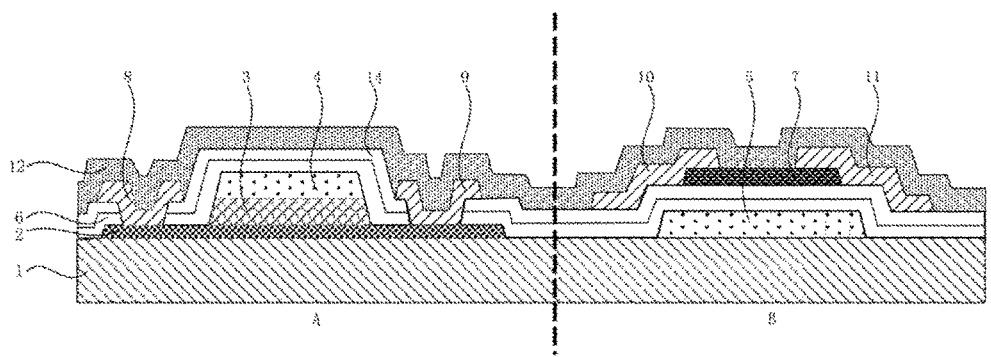

Referring to FIG. 9E, a third insulating layer may be disposed above the first source electrode 8, the first, drain electrode 9, the second source electrode 10, the second drain electrode 11, and the second insulating layer. The third insulating layer 12 may be, for example, made of $SiO_2$ or $SiN_x$, or a stacking structure made of $SiO_2$ and $SiN_x$. Optionally, the third insulating layer 12 may be formed via a plasma enhanced chemical vapor deposition method, and the fabrication temperature may be configured to be lower than or equal to 300° C.

Step S210: forming a second through-hole in a region of the third insulating layer corresponding to the first drain electrode.

Figure 9F:
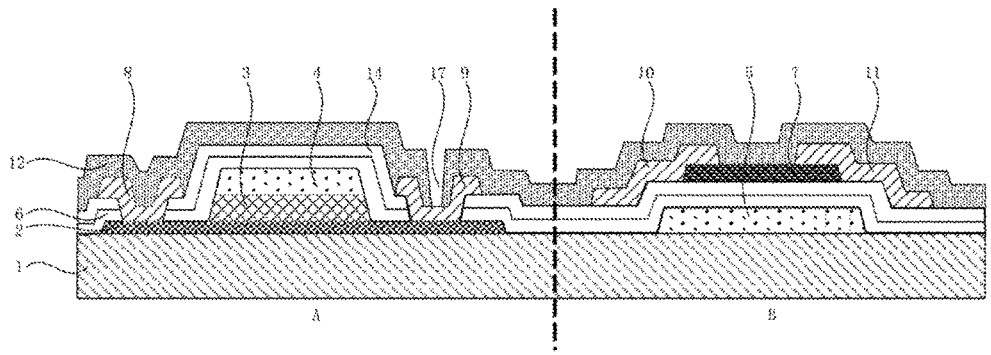

Referring to FIG. 9F, a second through-hole 17 may be formed in a region of the third insulating layer 12 corresponding to the first drain electrode 9. For example, the second through-hole 17 may be formed using a mask plate via a photo-etching method.

Step S210: forming a pixel electrode above the third insulating layer, where the pixel electrode is connected to the first drain electrode via the second through-hole.

Figure 9G:
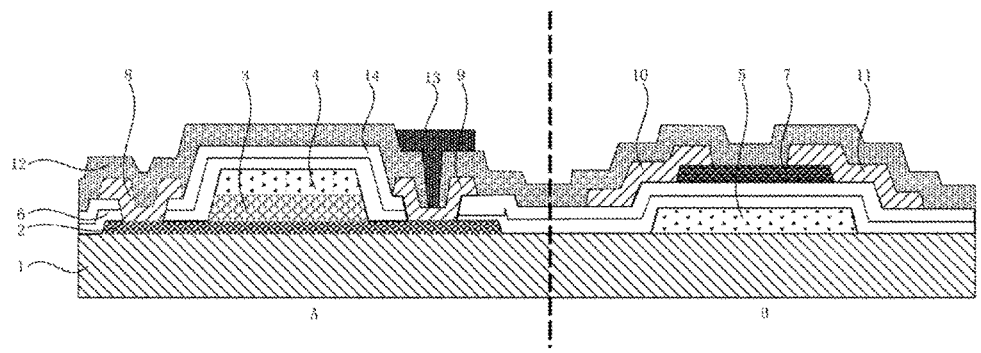

Referring to FIG. 9G, a pixel electrode 13 may be disposed above the third insulating layer 12, and the pixel electrode B is connected to the first drain electrode 9 via the second through-hole.

Optionally, before a metal oxide semiconductor thin film is disposed above the substrate 1, a buffer layer may be disposed above the substrate 1, and the metal oxide semiconductor thin film and the second gate electrode 5 may be disposed above the buffer layer. The buffer layer may improve the film quality of the metal oxide semiconductor layer 2 and the second gate electrode 5. For example, the buffer layer may be formed by stacking of a $SiO_2$ thin film and a $SiN_x$ thin film. In particular, the $SiN_x$ thin film may be configured to contact the metal oxide semiconductor layer 2.

In the disclosed embodiments shown, in FIG. 1-FIG. 10, a metal oxide thin film transistor may be disposed in the display region of the array substrate, and an amorphous silicon thin film transistor may be disposed in the peripheral circuit region of the array substrate, which may solve issue that the metal oxide thin film transistor may not simultaneously satisfy the requirements of the display panel, regarding the positive bias stability and the threshold voltage. Accordingly, the image display effect may be improved, and the stability and yield of the peripheral circuit region may be improved.

In certain embodiments, in the array substrate, amorphous silicon thin film transistors may be disposed in the peripheral circuit region of the array substrate, while metal oxide thin film transistors may be disposed in both the display region and the peripheral circuit region of the array substrate. For example, the vertical shift register (VSR) disposed peripheral circuit region of the array substrate may include a plurality of thin film transistors, which may form a plurality of cascaded shift registers. Each shift register may be connected to a corresponding scanning line and control the on-and-off of the first thin film transistor connected to the corresponding scanning line, thereby realizing scanning of each pixel in the display panel row by row.

Further, the plurality of thin film transistors in the shift register may include at least one pull-up thin film transistor and at least one pull-down thin film transistor. The at least one pull-up thin film transistor may be a metal oxide thin film transistor, which may occupy a substantially small area. Thus, the area occupied by the vertical shift register (VSR) may be reduced, and a narrow border design of the display panel may be facilitated. Meanwhile, the at least one pull-down thin film transistor may be an. amorphous silicon thin film transistor, which may increase the stability of vertical shift register (VSR). Thus, the stability and yield of the peripheral circuit region may be improved.

Figure 11:
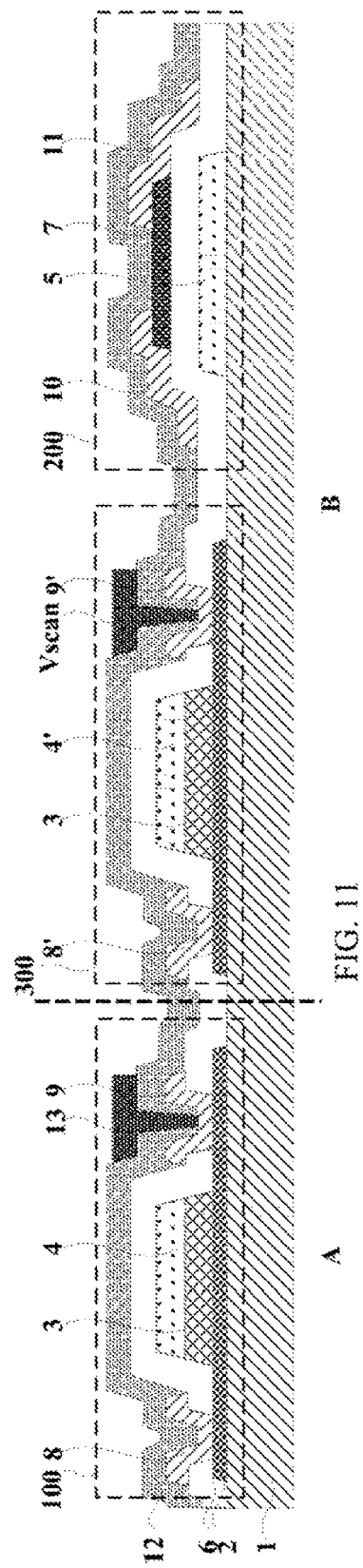
FIG. 11 illustrates a cross-sectional schematic view of another exemplary array substrate according to embodiments of the present disclosure.

FIG. 11 illustrates a cross-sectional schematic view of another exemplary array substrate according to embodiments of the present disclosure. As shown in FIG. 11, the array substrate may include a first thin film transistor 100 disposed in a display region. A of the array substrate, and a second thin film transistor 200 and a third thin film transistor 300 disposed in a peripheral circuit region B of the array substrate. Both the first thin film transistor 100 and the third thin film transistor 300 may be metal oxide thin film transistors, and the second thin film transistor 200 may be an amorphous silicon thin film transistor.

In particular, the array substrate may include a substrate 1, a metal oxide semiconductor layer 2, a first insulating layer 3, a first gate electrode 4, a second gate electrode 5, a second insulating layer 6, an amorphous silicon semiconductor layer 7, a first source electrode 8, a first drain electrode 9, a second source electrode 10, a second drain electrode 11, a third insulating layer 12, a pixel electrode 13, a third gate electrode 4', a third source electrode 8', a third drain electrode 9', and a scanning line scanning fine $V_{scan}$.

For example, the metal oxide semiconductor layer 2 may be disposed above the substrate 1 and located in both the display region A and the peripheral circuit region B of the array substrate. The first insulating layer 3 may be disposed above the metal oxide semiconductor layer 2. The first gate electrode 4 may be disposed above the first insulating layer 3 and located in the display region A of the array substrate. The third gate electrode 4' may be disposed above the first insulating layer 3 and located in the peripheral circuit region B of the array substrate.

The second gate electrode 5 may be disposed above the substrate 1 and be located in the peripheral circuit region 8 of the array substrate. The second insulating layer 6 may be disposed above the first gate electrode 4, the third gate electrode 4', the second gate electrode 5, the metal oxide semiconductor layer 2, and the substrate 1. The amorphous silicon semiconductor layer 7 may be disposed above the second insulating layer 6 and located in the peripheral circuit, region B of the array substrate.

The first source electrode 8, the first drain electrode 9, the third source electrode 8', the third drain electrode 9', the second source electrode 10, and the second drain electrode 11 may be disposed above the second insulating layer 6. Third through-holes may be formed in a region of the second insulating layer 6 corresponding to the metal oxide semiconductor layer in the display region A of the array substrate. In the display region A, the first source electrode 8 and the first drain electrode 9 may be connected to the metal oxide semiconductor layer 2 via the third through-holes, respectively. The metal oxide semiconductor layer in the display region A of the array substrate is referred as a first metal oxide semiconductor layer of the first thin film transistor.

Fourth through-holes may be formed in a region of the second insulating layer 6 corresponding to the metal oxide semiconductor layer in the peripheral circuit region B of the array substrate. In the peripheral circuit region B, the third source electrode 8' and the third drain electrode 9' may be connected to the metal oxide semiconductor layer 2 via the fourth through-holes, respectively. The metal oxide semiconductor layer in the peripheral circuit region B of the array substrate is referred as a second metal oxide semiconductor layer of the third thin film transistor.

The second source 10 and the second drain electrode 11 may be connected to the amorphous silicon semiconductor layer 7 in the peripheral circuit region B.

Further, the third insulating layer 12 may be disposed above the first source electrode 8, the first drain electrode 9, the third source electrode 8', the third drain electrode 9', the second source electrode 10, the second drain electrode 11, and the second insulating layer 6. In the display region A, a fifth through-hole may be formed in a region of the third insulating layer 12 corresponding to the first drain electrode 9. The pixel electrode 13 may be disposed above the third insulating 12, and connected to the first drain electrode 9 via the fifth through-hole. In the peripheral circuit region B, a sixth through-hole may be formed in a region of the third insulating layer 12 corresponding to the third, drain electrode 9'. The scanning line $V_{scan}$ may be disposed above the third insulating 12, and connected to the third drain electrode 9' via the sixth through-hole.

According, both the first thin film transistor 100 (e.g., the metal oxide thin film transistor) in the display region A of the array substrate and the third thin film transistor 300 (e.g., the metal oxide thin film transistor) in the peripheral circuit region B of the array substrate may have a top-gate structure. That is, the first gate electrode 4 may be disposed above the metal oxide semiconductor layer 2, and the third gate electrode 4' may be disposed above the metal oxide semiconductor layer 2. The first thin film transistor 100 and the third thin film transistor 300 may be fabricated in a same fabrication process, thereby simplifying the fabrication process.

Further, the second thin film transistor 200 (e.g., the amorphous silicon thin film transistor) disposed in the peripheral circuit region B of the array substrate may have a bottom-gate structure. That is, the second gate electrode 5 may fee disposed below the amorphous silicon semiconductor layer 7.

Further, the first gate electrode 4 of the first thin film transistor 100 (e.g., the metal oxide thin film transistor) may receive a scanning signal transmitted by the scanning line $V_{scan}$, and the first source electrode 8 of the first thin film transistor 100 may receive a data signal transmitted by a data line, thereby providing a working voltage to the pixel electrode 13.

Figure 12:
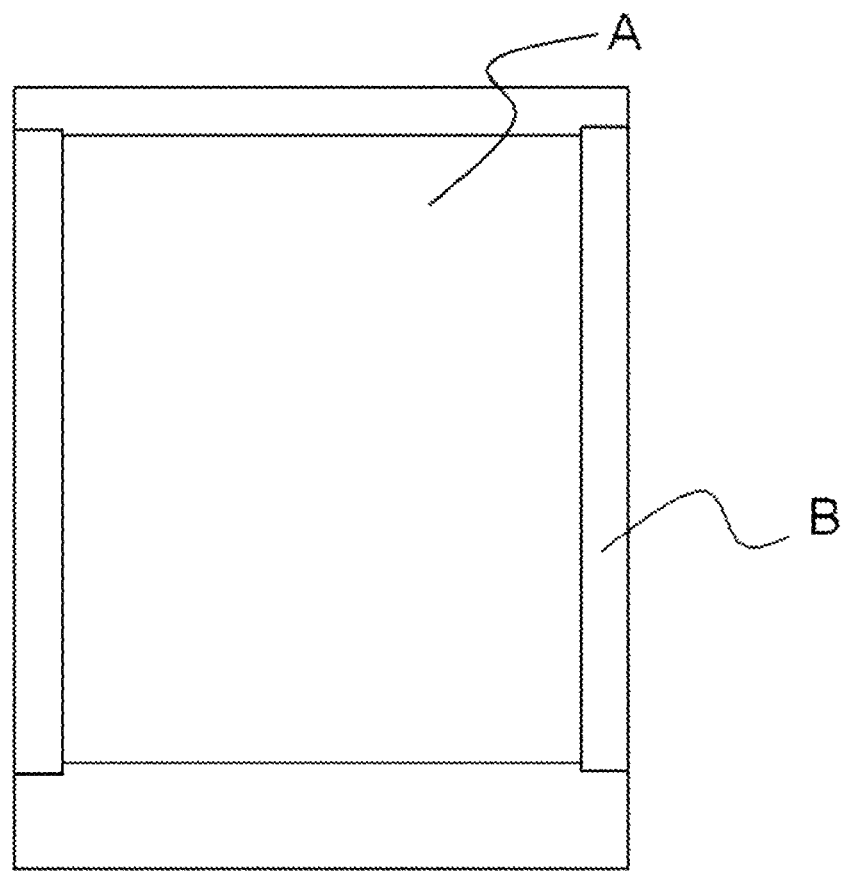
FIG. 12 illustrates a top view of another exemplary array substrate showing positions of a display region and a peripheral circuit region according to embodiments of the present disclosure.

FIG. 12 illustrates a top view of another exemplary array substrate showing positions of a display region A and a peripheral circuit region 6 according to embodiments of the present disclosure. As shown in FIG. 12, the array substrate may include a display region A and a non-display region surrounding the display region A. The non-display region may further include a peripheral circuit region B. For example, the peripheral circuit region B may be located on two sides of the display region A.

Further, the peripheral circuit region 6 may include a vertical shift register (VSR), and the VSR may include a plurality-of second thin film transistors (e.g., the amorphous silicon thin film transistor) and a plurality of third thin film transistors (e.g., the metal, oxide thin film transistor), which may form a plurality of cascaded shift registers. Each shift, register may be connected to a corresponding scanning line and control the on-and-off of the first thin film transistor connected to the corresponding scanning line, thereby scanning the pixels in the display panel row by row. An exemplary vertical shift register (VSR) is shown in FIGS. 13-FIG. 15.

Figure 13:
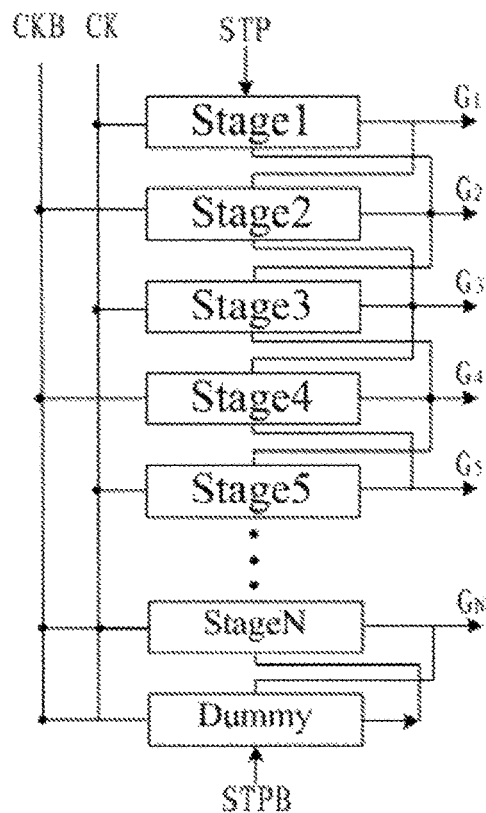
FIG. 13 illustrates a circuit diagram of an exemplary vertical shift register (VSR) in an exemplary army substrate according to embodiments of the present disclosure.
Figure 14:
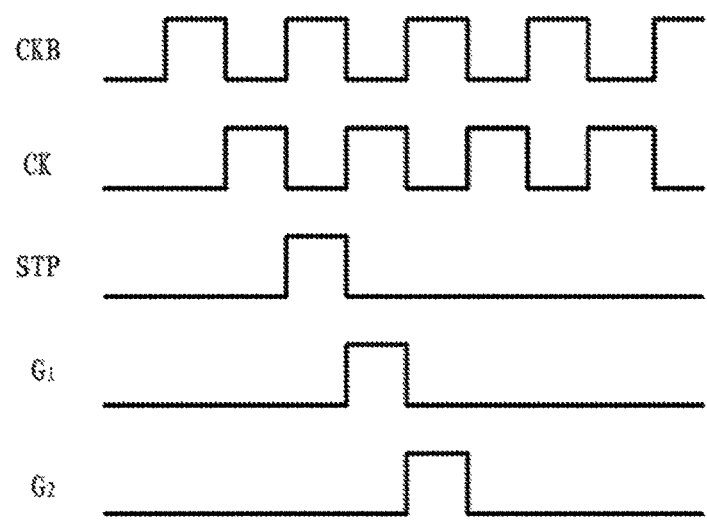
FIG. 14 illustrates an exemplary operation time sequence diagram of an exemplary VSR according to embodiments of the present disclosure.
Figure 15:
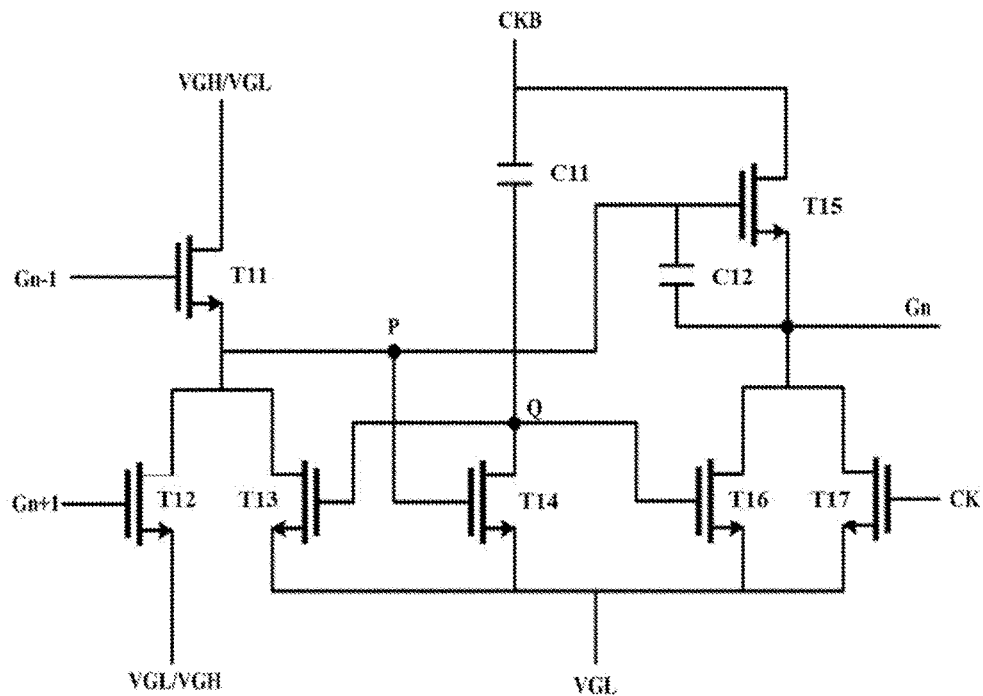
FIG. 15 illustrates an exemplary shift register in an exemplary VSR according to embodiments of the present disclosure.

FIG. 13 illustrates a circuit diagram of an exemplary vertical shift register (VSR) in an exemplary array substrate according to embodiments of the present disclosure, FIG. 14 illustrates an exemplary operation time sequence diagram of an exemplary VSR according to embodiments of the present disclosure, and FIG. 15 illustrates an exemplary shift register in an exemplary VSR according to embodiments of the present disclosure.

As shown in FIG. 13, the VSR may include N number of cascaded shift registers (denoted as Stage 1, Stage 2 . . . Stage N) and a virtual register (Dummy) at the last stage, where N is a positive integer larger than 1. When all the shift registers are cascaded together, the shift registers may be progressively opened or switched on. Among the N number of cascaded shift registers (denoted as Stage 1, Stage 2 . . . Stage N), the $1^{st}$ stage shift register (i.e., Stage 1) may have the lowest stage and the $N^{th}$ stage shift register (i.e., Stage N) may have the highest stage.

STP may be an external driving signal or trigger signal applied to first stage shift register Stage 1, STPB may be an external stop signal applied to the virtual register (Dummy). G1 is a $1^{st}$ line driving signal outputted by the $1^{st}$ stage shift register Stage 1 and inputted into a $1^{st}$ scanning line, G2 is a $2^{nd}$ line driving signal outputted by the $2^{nd}$ stage shift register Stage 2 and inputted in to a $2^{nd}$ scanning line, and so on. $G_N$ is an $N^{th}$ line driving signal outputted by the $N^{th}$ stage shift register Stage N and inputted into an $N^{th}$ scanning line. CKB and CK may be two phase-reversed or inverted clock signals, i.e., the clock signal CKB and the clock signal CK may be a clock signal and a clock bar signal, respectively.

An exemplary operation time sequence of the VSR is illustrated in detail based on FIG. 13 and FIG. 14. As shown in FIG. 13 and FIG. 14, when the external driving signal STP is transferred to the first stage shift register Stage 1, the $1^{st}$ stage shift register Stage 1 may output a $1^{st}$ line driving signal G1. Compared to the external driving signal STP, the $1^{st}$ line driving signal G1 may be delayed by one clock signal pulse width. Meanwhile, the $1^{st}$ line driving signal G1 may trigger the next stage shift register to be turned on for operation, i.e., the $2^{nd}$ stage shift register Stage 2. After the $2^{nd}$ stage register Stage 2 is turned on, the $2^{nd}$ stage register Stage 2 may output a $2^{nd}$ line driving signal G2 and, meanwhile, the $2^{nd}$ line driving signal G2 may be fed back to the previous shift register Stage 1 and may turn off the previous shift register Stage 1. Compared to the $1^{st}$ line driving signal G1, the $2^{nd}$ line driving signal G2 may be delayed by one clock signal pulse width.

Thus, from the stage shift register Stage 2 to the $N^{th}$ stage shift register Stage N, every shift register may be triggered by the driving signal outputted by the shift register which is one stage lower, and the output driving signal of every shift register may be delayed by one clock signal pulse width as compared to the shift register which is one stage lower. The last shift register Stage N may be turned off by the virtual register (Dummy) through the external stop signal STPB. CKB and CK may be two phase-reversed or inverted clock signals, i.e., the clock signal CKB and the clock signal CK may be a clock signal and a clock bar signal, respectively.

The disclosed VSR may drive the gate electrodes in the first thin film transistors in the display region A, and the first thin film transistors in the display region A may also be referred as pixel thin film transistors. For example, each shift register may drive the gate electrodes in a row of pixel TFTs (i.e., a pixel TFT row). That is, each shift register may drive a row of pixels (i.e., a pixel row). The output signal of the shift, register may switch on the pixel TFT row, such that corresponding source signals (i.e., signals applied to the source electrodes of the pixel TFT row) may be written into the pixel TFT row, and the pixel controlled by the pixel TFT which receives the source signal may be switched on to display an image.

In certain embodiments, the output driving signal of every shift register may be delayed by another number of clock signal pulse width as compared to the shift register which is one stage lower. For example, the output driving signal of every shift register may be delayed by two clock signal pulse widths as compared to the shift register which is one stage lower. In certain other embodiments, the output driving signal of every shift register may be delayed by a different number of clock signal pulse width as compared to the shift register which is one stage lower. For example, the $2^{nd}$ line driving signal G2 may be delayed by one clock signal pulse width as compared to the $1^{st}$ line driving signal G1, the $3^{rd}$ line driving signal G3 may be delayed by two clock signal pulse widths as compared to the second line driving signal G2, and so on.

FIG. 15 illustrates an exemplary shift register in an exemplary VSR according to embodiments of the present disclosure. For example, the shift register may be the stage shift register (i.e., Stage n) in the VSR having N number of shift registers (denoted as Stage 1, Stage 2 . . . Stage N). The $1s^t$ stage shift register (i.e., Stage 1) may have the lowest stage, and the $N^{th}$ stage shift register (i.e., Stage N) may have the highest stage, N is a positive integer larger than 1, and n is a positive integer equal to or smaller than N.

The $n^{th}$ stage shift register (i.e., Stage n) may include a plurality of transistors and at least one capacitor, and different transistors may achieve different functions, for example, pulling up a voltage, pulling down a voltage, or holding a voltage. Further, the $n^{th}$ stage shift register may include at least one pull-up transistor and at least one pull-down transistor.

In particular, the at least one pull-up transistor may be a third thin film transistor, i.e., a metal oxide thin film transistor. The pull-up transistor may clamp the output voltage of the transistor at a high level, for example, the pull-up transistor may clamp the output voltage of the shift register at a high level, such that the shift register may be able to output the desired driving voltage. Due to the voltage-pulling-up capability, the pull-up transistor may directly affect the voltage-output capability of the shift register, for example, the amplitude of the driving voltage outputted by the shift register.

Because the carrier-mobility of the metal-oxide semiconductors is at least 20 times higher than the carrier mobility of amorphous silicon, to realize a same voltage-output capability of the shift register, the pull-up thin film transistor having a metal oxide active layer may be configured to have a much smaller channel width than the pull-up transistor having an amorphous silicon active layer. For example, to realize a same voltage-output capability of the shift register, for the pull-up transistor for clamping the output voltage of the shift register at a high level, the amorphous silicon thin film transistor may have a channel width of approximately 3000 μm, while the metal oxide thin film transistor may have a channel width below 150 µm. Thus, to realize a same voltage-output capability of the shift register, the metal oxide pull-up thin film transistor may occupy a substantially small area and, accordingly, the area occupied by the VSR may be reduced, and a narrow border design of the display panel may be facilitated.

Meanwhile, the at least one pull-down transistor may be a second thin film transistor, i.e., an amorphous silicon thin film transistor. The pull-down transistors may be used to clamp the output voltage of the transistor at a lower level. The threshold voltage of the metal oxide thin film transistor tends to shift negatively after being biased by a negative voltage for a long time. That is, the threshold voltage of the metal oxide thin film transistor changes from greater than 0 to less than 0, thereby causing the pull-down thin, film transistor to have an substantially high off-state current ($I_{off}$, also called as leak current) when the gate-source voltage ($V_{gs}$) of the pull-down thin film transistor is 0, which may lead to a current failure of the VSR, As a comparison, the threshold voltage of the amorphous silicon thin film transistor is less sensitivity to or affected by the negative biased voltage than the threshold voltage of the metal oxide thin film transistor. That is, the threshold voltage of the amorphous silicon thin film transistor is less negatively shift after being biased by a negative voltage for a long time. Thus, a current failure of the VSR may be less likely to occur, which may increase the stability of vertical, shift register (VSR). Accordingly, the stability and yield of the peripheral circuit region may be improved.

In one embodiment, as shown in FIG. 15, the shift register (i.e., Stage n) may include a first transistor T11, a second transistor T12, a third transistor T13, a fourth transistor T14, a fifth transistor T15, a sixth transistor T16, a seventh transistor T17, a first capacitor C11 and a second capacitor C12. The second electrode of the first transistor T11, the first electrode of the second transistor T12, the first electrode of the third transistor T13, the gate electrode of the fourth transistor T14, and the gate electrode of the fifth transistor T15 may meet to form a junction P. The first plate of the second capacitor C12 may also be connected to the junction P. The gate electrode of the third transistor T13, the gate electrode of the sixth transistor T16 and the first electrode of the fourth transistor T14 may meet to form a junction Q. The first plate of the first capacitor C11 may also be connected to the junction Q.

Further, the second plate of the second capacitor C12, the first electrode of the filth transistor T15, the first electrode of the sixth transistor T16, and the first electrode of the seventh transistor T17 may meet to form the output terminal $G_n$ of the shift register Stage n. The gate electrode of the first transistor T11 may be connected to the output terminal $G_{n-1}$ of the shift register which is one stage lower, i.e., the (n+1)$^{th}$ stage shift register Stage (n−1). The gate electrode of the second transistor T12 may be connected to the output, terminal $G_{n+1}$ of the shift register which is one stage higher, i.e., the (n+1)$^{th}$ stage shift register Stage (n+1).

In particular, the gate electrode of the first transistor T11 in the 1$^{st}$ shift register (i.e., Stage 1) maybe connected to the external driving signal STP, and the gate electrode of the second transistor T12 in the last shift register (i.e., Stage N) may be connected to the output terminal of the virtual shift register (Dummy). The last shift register may be shut down by the virtual register (Dummy) through the external stop signal STPB. Further, the second electrode of the third transistor T13, the second electrode of the fourth transistor T14, the second electrode of the sixth transistor T16, and the second electrode of the seventh transistor T17 maybe connected to a low voltage signal VGL. The first capacitor C11 may couple the first clock signal CKB to the junction Q, and the second capacitor C12 may be a bootstrap capacitor.

In one embodiment during a forward scanning (i.e. the 1$^{st}$ stage shift register Stage 1 to the last stage shift register Stage N may gradually output the driving voltage), the first electrode of the first transistor T11 may be connected to a high voltage signal VGH, and the second electrode of the second transistor T12 may be connected to a low voltage signal VGL. The high voltage signal VGH applied to the first electrode of the first transistor T11 may charge the junction P, while the low voltage signal VGL applied to the second electrode of the second transistor T12 may discharge the junction P.

During a reverse scanning (i.e. the last stage shift register Stage N to the 1$^{st}$ stage shift register Stage 1 may gradually output the driving voltage), the first electrode of the first transistor T11 may be connected to the low voltage signal VGL, and the second electrode of the second transistor T12 may be connected to the high voltage signal VGH. The low voltage signal VGL applied to the first electrode of the first transistor T11 may discharge the junction P, while the high voltage signal VGH applied to the second electrode of the second transistor T12 may charge the junction P.

The second plate of the first capacitor C11 and the second electrode of the filth transistor T15 may be connected to a first clock signal CKB. The gate electrode of the seventh transistor T17 maybe connected to a second clock signal CK. The first clock signal CKB and the second clock signal CK may be two phase reversed or inverted clock singles. That is, the first clock signal CKB may be an inverted clock signal of the second clock signal CK and, meanwhile, the second clock signal CK may be an inverted clock signal of the first clock signal CKB.

In the disclosed embodiments, all the transistors in the shift registers may be N-type transistors. For example, in the forward scanning, the first electrode of the first transistor T11 may be connected to the high voltage signal VGH, charging the junction P. The second electrode of the second transistor T12 may be connected to the low voltage signal. VGL, discharging the junction P. When the junction P is not charged, the third transistor T13 may pull down the voltage at the junction P during a time period when the first clock signal CKB is at a high level, the fourth transistor T14 may be in the OFF state, and the sixth transistor T16 may pull down the output voltage Gn. When the junction P is charged, the sixth transistor T16 may be in the OFF state, the fourth transistor T14 may be in the ON state, the voltage at the junction Q may be clamped at the low voltage VGL. Thus, the third transistor T13 may be in the OFF state, and the fifth transistor T15 may pull up the output voltage Gn during the rising edge of the first clock signal CKB, while pull down the output voltage Gn during the falling edge of the first clock signal CKB.

In the disclosed embodiments, the first transistor T11 and the filth transistor T15 may be the pull-up transistors in the shift register, and the second transistor T12, the third transistor T13, the fourth transistor T14, the sixth transistor T16 and the seventh transistor T17 may be the pull-down transistors in the shift register.

In one embodiment, at least one of the pull-up transistors (i.e., at least one of the first transistor T11 and the fifth transistor T15) may be a third thin film transistor, i.e., a metal oxide thin film transistor, which may occupy a substantially small area. Thus, the area occupied by the vertical shift register (VSR) may be reduced, and a narrow border design of the display panel may be facilitated. Meanwhile, at least one of the pull-down transistors (i.e., at least one of the second transistor T12, the third transistor T13, the fourth transistor T14, the sixth transistor T16 and the seventh transistor T17) may be a second thin film transistor, i.e., an amorphous silicon thin film transistor, which may increase the stability of VSR. Thus, the stability and yield of the peripheral circuit region may be improved.

In another embodiments, the shift register may include a plurality of pull-up transistors and a plurality of pull-down transistors. More than one pull-up transistors may be the third thin film transistors, i.e., metal oxide thin film transistors, and more than one pull-down transistors maybe the second thin film transistors, i.e., amorphous silicon thin film transistors. In another embodiments, the shift register may include a plurality of pull-up transistors and a plurality of pull-down transistors. All the pull-up transistors may be the third thin film, transistors, i.e., metal oxide thin film transistors, and all the pull-down transistors may be the second thin film transistors, i.e., amorphous silicon thin film transistors. Accordingly, the area occupied by the vertical shift register (VSR) may be further reduced, a narrow border design of the display panel may be further facilitated, and the stability and yield of the peripheral circuit region may be further improved.

Figure 16:
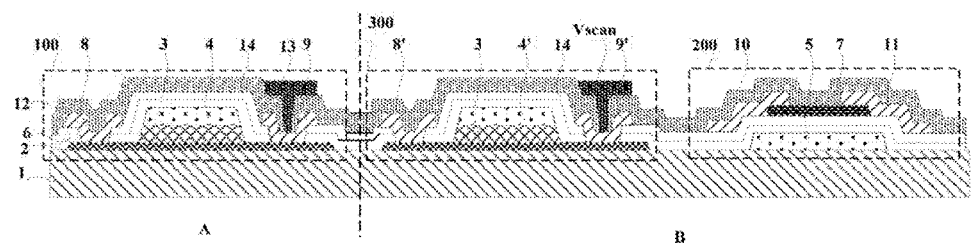
FIG. 16 illustrates a cross-sectional schematic view of another exemplary array substrate according to embodiments of the present disclosure.

FIG. 16 illustrates a cross-sectional schematic view of another exemplary array substrate according to embodiments of the present disclosure. The similarities between FIG. 16 and FIG. 11 are not repeated here, while certain differences, may be explained.

As shown in FIG. 16, different from the array substrate in FIG. 11, the array substrate in FIG. 16 may further include a fourth insulating layer 14. In particular, the fourth insulating layer 14 may be disposed, above the second insulating layer 6, and the fourth insulating layer 14 and the amorphous silicon semiconductor layer 7 may be formed continuously in a same chamber. Accordingly, the change of the fabrication chamber and the transmission of the sample may be avoided, the fabrication processes of the array substrate may be effectively simplified, and the fabrication-period may be shortened, thereby improving a fabrication efficiency of the array substrate.

In one embodiment, a material of the second insulating layer 6 may include $SiO_2$ or $SiN_x$. For example, the material of the second insulating layer 6 may include $SiO_2$, and a material of the fourth insulating layer 14 may include $SiN_x$. The second insulating layer 6 may be made of $SiO_2$ and in contact with the metal oxide semiconductor layer 2, thereby avoiding impact of an insulating layer with a relatively high hydrogen content (e.g., $SiN_x$) on the electrical performance of the metal oxide semiconductor layer 2 in a fabrication process. The fourth insulating layer 14 may be made of $SiN_x$ and in contact with the amorphous silicon semiconductor layer 7. The fourth insulating layer 14 may be further used as a buffer passivation layer for the amorphous silicon semiconductor layer 7, thereby improving the film quality of the amorphous silicon semiconductor layer 7.

In one embodiment, a material of the first insulating layer 3 may include $SiO_2$, and a material of the third insulating layer 12 may include at least one of $SiO_2$ and $SiN_x$. The first insulating layer 3 may be made of $SiO_2$ and in contact with the metal oxide semiconductor layer 2, thereby avoiding the impact of the insulating layer with a relatively high hydrogen content (e.g., $SiN_x$) on the electrical performance of the metal oxide semiconductor layer 2. The third insulating layer 12 may be made of a stacking structure formed by $SiO_2$, or $SiN_x$, or a combination thereof, and in contact with the amorphous silicon semiconductor layer 7. The third insulating layer 12 may be used as a buffer passivation layer of the amorphous silicon semiconductor layer 7, thereby improving the film quality of the amorphous silicon semiconductor layer 7.

In one embodiment, an active layer of the metal oxide thin film transistor (i.e., the metal oxide semiconductor layer 2 in FIG. 11 and FIG. 16) may be made a metal oxide formed by one or more elements selected from Zn, Ga, In, Sn, Al, Hf, C, B, M and S. For example, the active layer of the metal oxide thin film transistor maybe made of Indium Gallim Zinc Oxide (IGZO). IGZO may be an amorphous oxide comprising indium, gallim, and zinc.

Further, the carrier mobility of IGZO may be relatively high, thereby improving a charge-discharge rate of the metal oxide thin film transistor towards the pixel electrode. A response rate of the pixels may be improved, thereby increasing the scanning rate of the pixels. Accordingly, the implementation of an ultra-high resolution may become possible. The active layer of the metal oxide thin film transistor may be, for example, formed by a method such as magnetron sputtering, etc. The present disclosure is not intended to limit the fabrication processing, of the active layer of the metal oxide thin film transistor.

Figure 17:
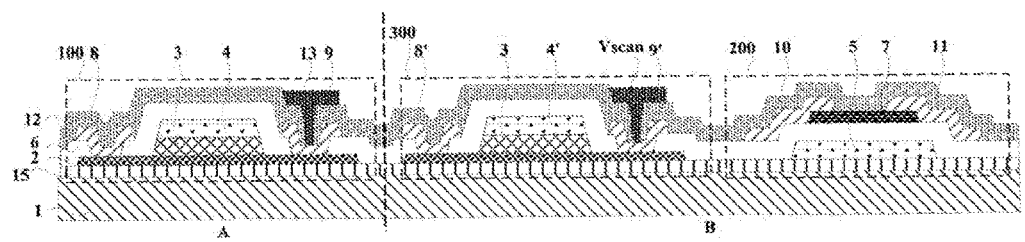
FIG. 17 illustrates a cross-sectional schematic view of another exemplary array substrate according to embodiments of the present disclosure.

FIG. 17 illustrates a cross-sectional schematic view of another exemplary array substrate according to embodiments of the present disclosure. The similarities between FIG. 17 and FIG. 11 are not repeated here, while certain differences may be explained.

As shown in FIG. 17, different from the array substrate in FIG. 11, the array-substrate in FIG. 17 may further include a buffer layer 15. In particular, the buffer layer 15 may be sandwiched between the metal oxide semiconductor layer 2 and the substrate 1 and, meanwhile, between the second gate electrode 5 and the substrate. The buffer layer 15 may improve the film quality of the metal oxide semiconductor layer 2 and the gate electrode 5. For example, the buffer layer 15 may be formed by stacking of the $SiO_2$ thin films and the $SiN_x$ thin films. In particular, the $SiN_x$ thin film may be configured to contact the metal oxide semiconductor layer 2.

In one embodiment, when the disclosed array substrate is implemented into an organic light-emitting display panel, the display region A of the array substrate may include a plurality of pixel driving circuits. A pixel driving circuit may include at least two first thin film transistors and at least one capacitor. For example, FIG. 18 illustrates a structural schematic view of an exemplary pixel driving circuit according to embodiments of the present disclosure.

Figure 18:
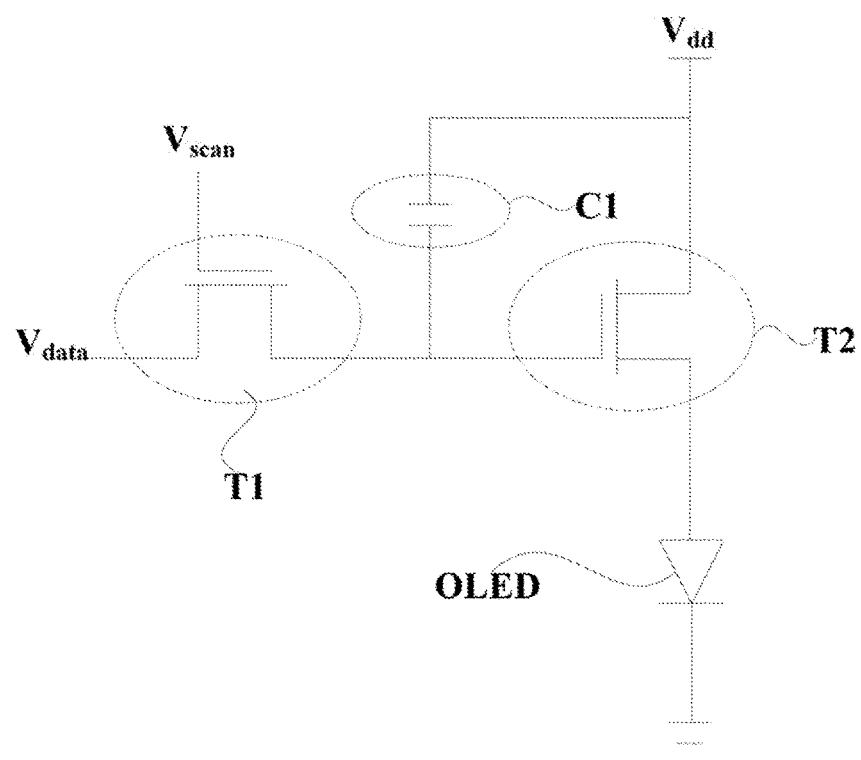
FIG. 18 illustrates a structural schematic view of another exemplary pixel driving circuit according to embodiments of the present disclosure.

As shown in FIG. 18, the pixel driving circuit may include two first thin film transistors and one capacitor. In particular, a first gate electrode of the first thin film transistor T1 may be connected to a scanning line $V_{scan}$, a first source electrode of the first thin film transistor T1 may be connected to a first gate electrode of another first thin film transistor T2, and a drain electrode of the first thin film transistor T1 may be connected to a data line $V_{data}$.

Further, a first electrode of the capacitor C1 may be connected to a first gate electrode of the first thin film transistor T2 and the first source electrode of the first thin film transistor T1, and a second electrode of the capacitor C1 may be connected to the first drain electrode of the first thin film transistor T2 and a working power source end $V_{dd}$. A first source electrode of the first thin film transistor T2 may be connected to an anode of an organic light-emitting display (OLED) panel.

When the scanning line is selected, the first thin film transistor T1 may be turned on, the data voltage may charge the capacitor C1 via the first thin film transistor T1, and the voltage of the capacitor C1 may control a drain electrode current of the first thin film transistor T2. When the scanning line is not selected, the first thin film transistor T1 may be turned off the electrical charges stored in the capacitor C1 may maintain a gate electrode voltage of the first thin film transistor T2. Accordingly, the first thin film transistor T2 may remain an "on" state, such that the OLED may be in a state controlled by a constant current.

FIG. 18 only illustrates a structural schematic view of a pixel driving circuit comprising two first thin film transistors and one capacitor. The present disclosure is, however, not intended to limit the number of the first thin film transistors and the number of capacitors included in the pixel driving circuit. For example, the pixel driving circuit of the array substrate may include three first thin film transistors and one capacitor.

Figure 19:
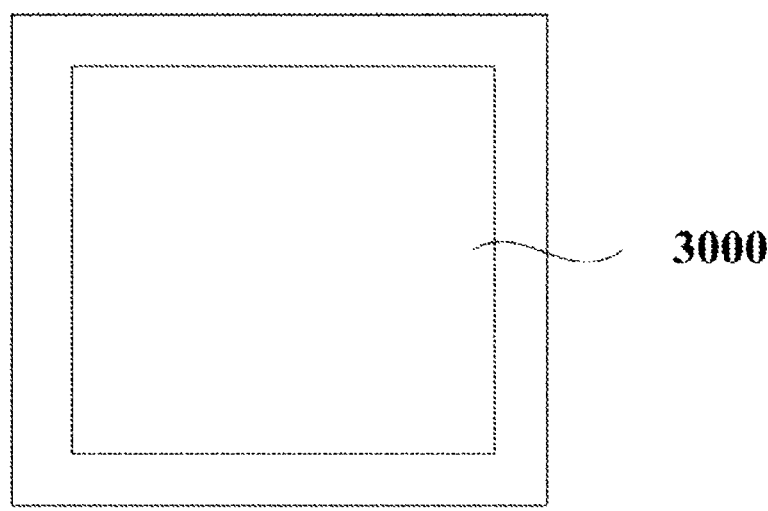
FIG. 19 illustrates a structural schematic view of another exemplary display panel according to embodiments of the present disclosure.

The present disclosure also provides a display panel. FIG. 19 illustrates a structural schematic view of another exemplary display panel according to embodiments of the present disclosure. As shown in FIG. 19, the display panel may include an array substrate 3000, which may be any one of the disclosed array substrates.

Because the disclosed display panel includes any one of the disclosed array substrates, the disclosed display panel may have beneficial effects as the disclosed array substrates, which are not described herein. For example, the disclosed display panel may be a liquid crystal display panel, an organic light-emitting display panel OLED, or any appropriated display panels having a display function. Further, the organic light-emitting display panel may be applied to any product or component having a display function, such as a notebook, a tablet, or a display device, etc.

Further, the present disclosure also provides a fabrication method of an array substrate, and the method may include forming a first thin film transistor, a second thin film transistor, and a third thin film transistor above a substrate.

Both the first thin film transistor and the third thin film transistor may be metal oxide thin film transistors, and the second thin film transistor may be an amorphous silicon thin film transistor. The first thin film transistor may be disposed in a display region of the array substrate, and the third thin film transistor and the second thin film transistor may be disposed in a peripheral circuit region of the array substrate.

On one hand, by disposing the metal oxide thin film transistor in the display region of the array substrate and disposing the amorphous silicon thin film transistor in the peripheral circuit region of the array substrate, the present disclosure may solve issues that the metal oxide thin film transistor cannot satisfy requirements of the display panel regarding the positive bias stability and the threshold voltage. Thus, the image display effect maybe improved, and the stability and yield of the peripheral circuit region may be improved.

On the other hand, by disposing the metal oxide thin film transistor and the amorphous silicon thin film transistor in the peripheral circuit region of the array substrate, i.e., by configuring the shift register in the VSR to include at least one pull-up transistor which is a metal oxide thin film transistor and at least one pull-down transistor which is an amorphous silicon thin film transistor, the area occupied by the vertical shift register (VSR) may be reduced, a narrow border design of the display panel may be facilitated; and the stability of vertical shift register (VSR) may be improved.

Figure 20:
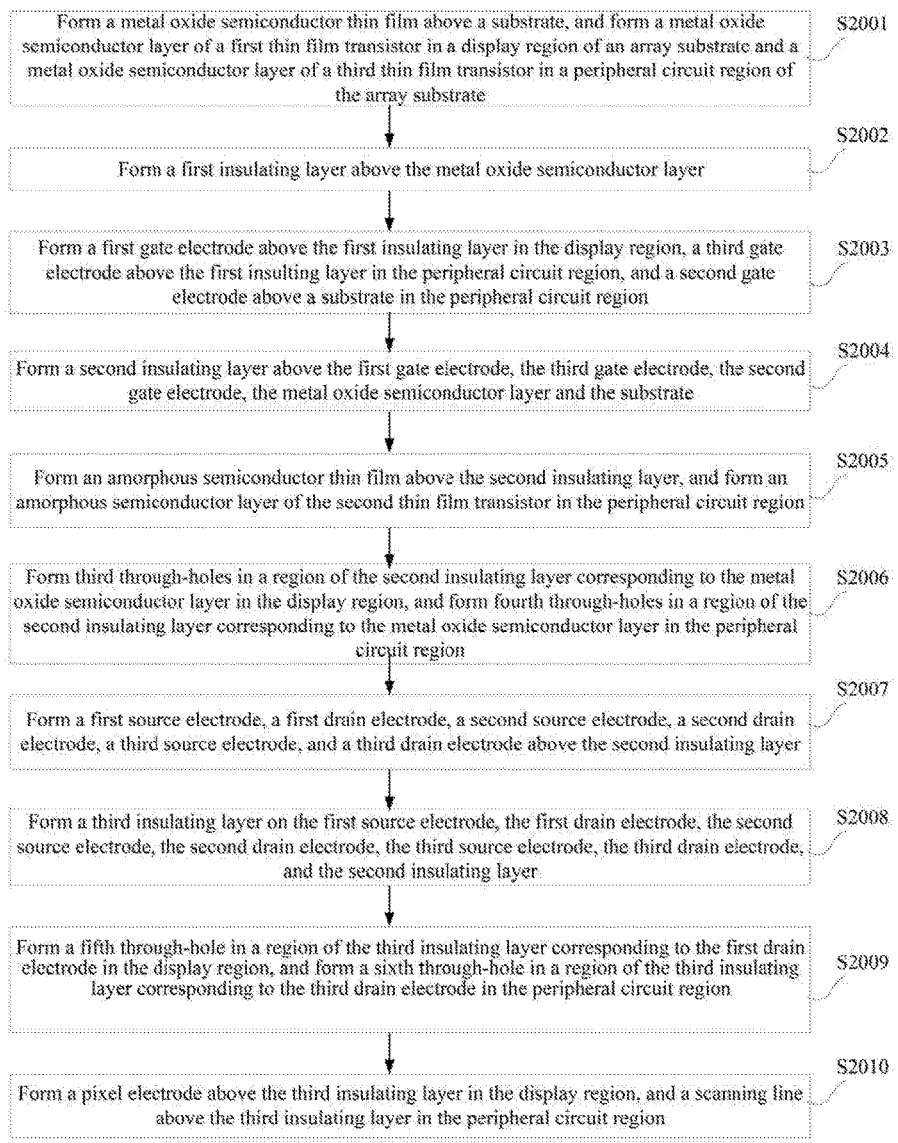
FIG. 20 illustrates a flow chart of another exemplary array substrate fabrication method according to embodiments of the present disclosure.

FIG. 20 illustrates a flow chart of another exemplary array substrate fabrication method according to embodiments of the present disclosure, and FIG. 21A-FIG. 21J illustrate cross-sectional schematic views of each step in FIG. 20.

As shown in FIG. 20, the array substrate fabrication method may comprise the following steps.

Step S2001: forming a metal oxide semiconductor thin film above a substrate, and forming a metal oxide semiconductor layer of a first thin film transistor in a display region of the array substrate and a metal oxide semiconductor layer of a third thin film transistor in a peripheral circuit region of the array substrate via a patterning process. The metal oxide semiconductor layer of the first thin film transistor in the display region of the array substrate and the metal oxide semiconductor layer of the third thin, film transistor in the peripheral circuit region of the array substrate may be formed via the same patterning process. The metal oxide semiconductor layer formed in the display region of the army substrate is referred as a first metal oxide semiconductor layer of the first thin film transistor, and the metal oxide semiconductor layer formed in the peripheral circuit region of the array substrate is referred as a second metal oxide semiconductor layer of the third thin film transistor.

Figure 21A:
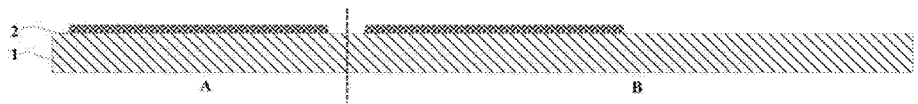
FIG. 21A-FIG. 21J illustrate cross-sectional schematic views of each step in FIG. 20.

For example, a metal oxide semiconductor thin film may be disposed above the substrate via a method, such as a physical or chemical vapor deposition (CVD). A patterning process may be performed on the metal oxide semiconductor, including, for example, spin-coating of a photo-resist, exposure, developing, and etching. Referring to FIG. 21A, a metal oxide semiconductor layer 2 may be formed above the substrate 1 in the display region A and the peripheral circuit region B of the array substrate. The material of the metal oxide semiconductor layer 2 may be, for example, IGZO.

Step S2002: forming a first insulating layer above the metal oxide semiconductor layer in the display region and the peripheral circuit region of the array substrate.

Figure 21B:
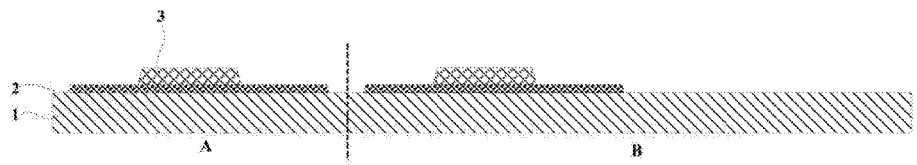

Referring to FIG. 21B, a first insulating layer 3 may be disposed above the metal oxide semiconductor layer 2 in the display region A and the peripheral circuit region B of the array substrate. The first insulating layer 3 may be made of a material such as $SiO_2$. In one embodiment, a plasma enhanced chemical vapor deposition method, may be used to fabricate the first insulating layer 3, and the fabrication temperature may be configured to be lower than 220° C. The plasma enhanced chemical vapor deposition needs a relatively low deposition, thereby having a relatively small effect on the structure and physical properties of a film layer. Accordingly, the thickness and composition of the formed film layer may be relatively uniform, the film layer may be relatively dense, and the adhesion may be strong.

Step S2003: forming a first gate electrode above the first insulting layer in the display region of the array substrate, forming a third, gate electrode above the first insulting layer in the peripheral circuit region of the array substrate, and forming a second gate electrode above the substrate in a peripheral circuit region of the array substrate.

Figure 21C:
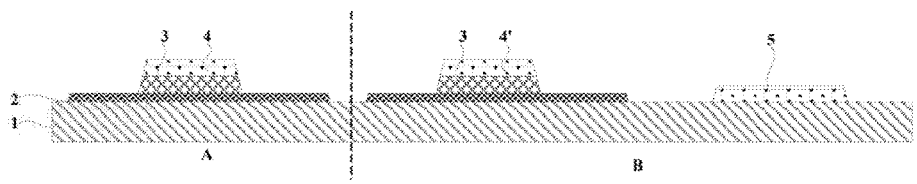

Referring to FIG. 21C, for example, a layer of gate electrode metal material may be disposed on the first insulating layer 3 in the display region A of the array substrate and in the peripheral circuit region B of the array substrate, and on the substrate 1 in the peripheral circuit region B of the array substrate via a method of sputtering or evaporation. A patterning process may be performed on the gate electrode metal material layer to form a first gate electrode 4, a third gate electrode 4', and a second gate electrode 5.

Step S2004: forming a second insulating layer on the first gate electrode, the third gate electrode, the second gate electrode, the metal oxide semiconductor layer, and the substrate.

Figure 21D:
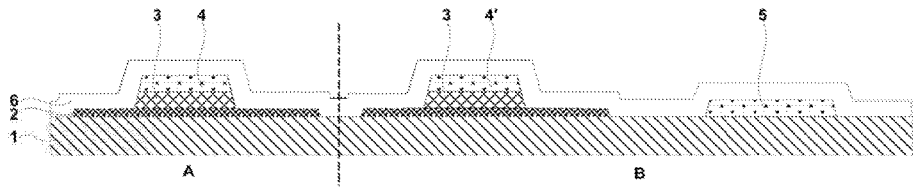

Referring to FIG. 21D, a second insulating layer 6 may be disposed above the first gate electrode 4, the third gate electrode 4', the second gate electrode 5, the metal oxide semiconductor layer 2, and the substrate 1. The material of the second insulating layer 6 may be, for example, $SiO_2$ or $SiN_x$. In one embodiment, a plasma enhanced chemical vapor deposition (PECVD) method may be applied to form the second insulating layer 6, and the fabrication temperature may be lower than or equal to 220° C.

Step S2005: forming an amorphous silicon semiconductor thin film above the second insulating layer, and forming an amorphous silicon semiconductor layer of the second thin film transistor in the peripheral circuit region of the array substrate via a patterning process.

Figure 21E:
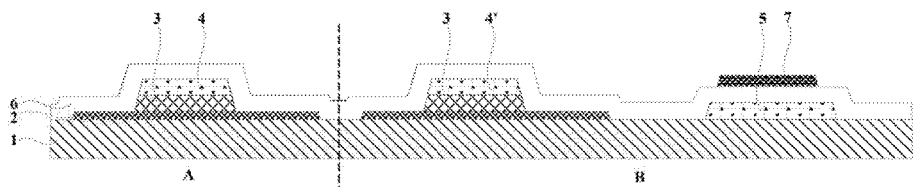

Referring to FIG. 21E, an amorphous silicon semiconductor thin film 7 may be disposed above the second insulating layer 6. A patterning process may be performed cm the amorphous silicon semiconductor thin film 7, such that an amorphous silicon semiconductor thin film pattern (i.e., the amorphous silicon semiconductor layer 7) may be formed on the second insulating layer 6 in the peripheral circuit region B of the array substrate. In one embodiment, the amorphous silicon semiconductor thin film may be formed via a plasma enhanced chemical vapor deposition method, and the fabrication temperature may be configured to be lower than or equal to 300° C.

Because the amorphous silicon semiconductor thin film is made of amorphous silicon, when the fabrication temperature increases, the crystallization degree of the amorphous silicon semiconductor and the mobility may be increased. However, an excess temperature may easily affect the electrical performance of the formed metal oxide semiconductor layer 2. Thus, the fabrication temperature of the amorphous silicon semiconductor thin film may be selected to be lower than or equal to 300° C.

Step S2006: forming third through-holes in a region of the second insulating layer corresponding to the metal oxide semiconductor layer in the display region of the array substrate, and forming fourth through-holes in a region of the second insulating layer corresponding to the metal oxide semiconductor layer in the peripheral circuit region of the array substrate.

Figure 21F:
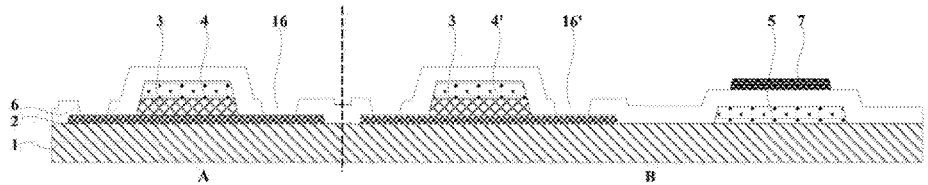

Referring to FIG. 21F, third through-holes 16 may be formed in the region of the second insulating layer 6 corresponding to the metal oxide semiconductor layer 2 in the display region A of the array substrate, and fourth through-holes 16' may be formed in the region of the second insulating layer 6 corresponding to the metal oxide semiconductor layer 2 in the peripheral circuit region E of the array substrate. In one embodiment, the third through-holes 16 and the fourth through-holes 16' may be formed by using a mask plate via a photo-etching method.

Step S2007: forming a first source electrode, a first drain electrode, a second source electrode, a second drain electrode, a third source electrode, and a third drain electrode above the second insulating layer. The first source electrode and the first drain electrode are connected to the metal oxide semiconductor layer in the display region of the array substrate via the third through-holes, the third source electrode and the third drain electrode are connected to the metal oxide semiconductor layer in the peripheral circuit region of the array substrate via the fourth through-holes, and the second source electrode and the second drain electrode are connected to the amorphous silicon semiconductor layer.

Figure 21G:
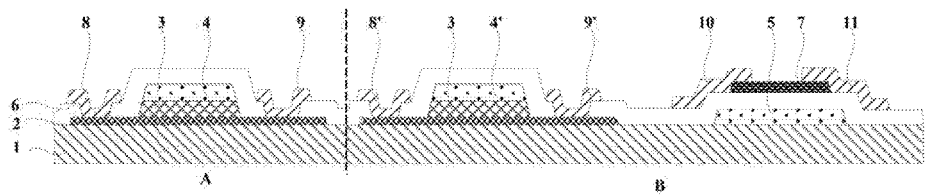

Referring to FIG. 21G, a first source electrode 8, a first drain electrode 9, a third source electrode 8', a third drain electrode 9', a second source electrode 10, and a second drain electrode 11 may be disposed above the second insulating layer 6. In particular, the first source electrode 8 and the first drain electrode 9 may be connected to the metal oxide semiconductor layer 2 in the display region A of the array substrate via the third through-holes, the third source electrode 8' and the third drain electrode 9' may be connected to the metal oxide semiconductor layer in the peripheral circuit region B of the array substrate via the fourth through-holes, and the second source electrode 10 and the second dram electrode 11 may be connected to the amorphous silicon semiconductor layer 7.

Step S2008: forming a third insulating layer above the first source electrode, the first drain electrode, the second source electrode, the second drain electrode, the third source electrode, the third drain electrode, and the second insulating layer.

Figure 21H:
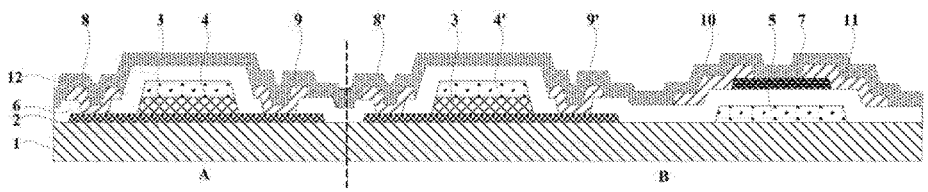

Referring to FIG. 21H, a third insulating layer 12 may be disposed above the first source electrode 8, the first drain electrode 9, the third source electrode 8', the third drain electrode 9', the second source electrode 10, the second drain electrode 11, and the second insulating layer 6. A material of the third insulating layer 12 may be, for example, made of $SiO_2$, $SiN_x$, or a stacking structure formed by $SiO_2$ and $SiN_x$. In one embodiment, the third insulating layer 12 maybe formed via a plasma enhanced chemical vapor deposition method, and the fabrication temperature may be configured to be lower than or equal to 300° C.

Step S2009: forming a fifth through-hole in a region of the third insulating layer corresponding to the first drain electrode in the display region of the array substrate, and forming a sixth through-hole in a region of the third insulating layer corresponding to the third drain electrode in the periphery circuit region of the array substrate.

Figure 21I:
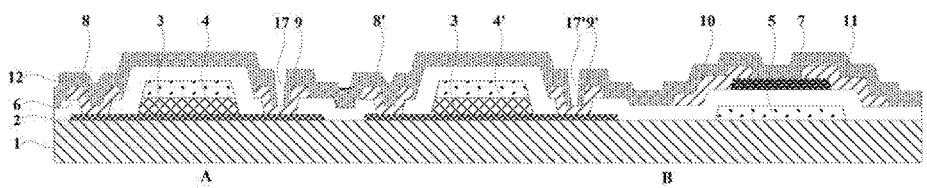

Referring to FIG. 21I, a fifth through-hole 17 may be formed in a region of the third insulating layer 12 corresponding to the first drain electrode 9 in the display region A of the array substrate, and a sixth through-hole 17' may be formed in a region, of the third insulating layer 12 corresponding to the first drain electrode 9 in the periphery circuit region B of the array substrate. In one embodiment, the fifth through-hole 17 and the sixth through-hole 17' may be formed using a mask plate via a photo-etching method.

Step S2010: forming a pixel electrode above the third insulating layer in the display region of the array substrate, and a scanning line above the third insulating layer in periphery circuit region of the array substrate. The pixel electrode is connected to the first drain electrode via the fifth through-hole, and the scanning line is connected, to the third drain electrode via the sixth through-hole.

Figure 21J:
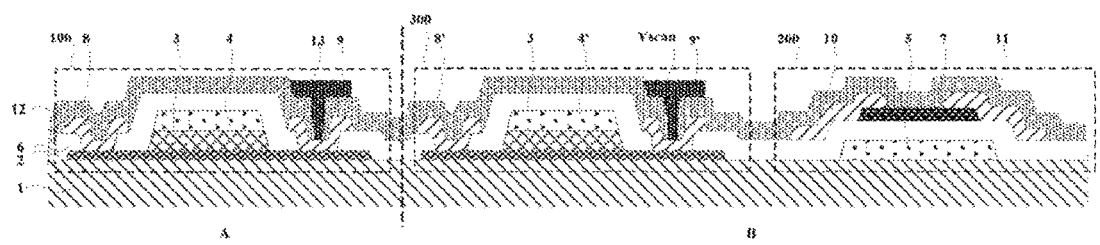

Referring to FIG. 21J, a pixel electrode 13 may be disposed above the third insulating layer 12 in the display region A of the array substrate, and a scanning line $V_{scan}$ may be disposed above the third insulating layer 12 in periphery circuit region B of the array substrate. The pixel electrode 13 may be connected to the first drain electrode 9 via the fifth through-hole, and the scanning line $V_{scan}$ may be connected to the third drain electrode 9' via the sixth through-hole.

Figure 22:
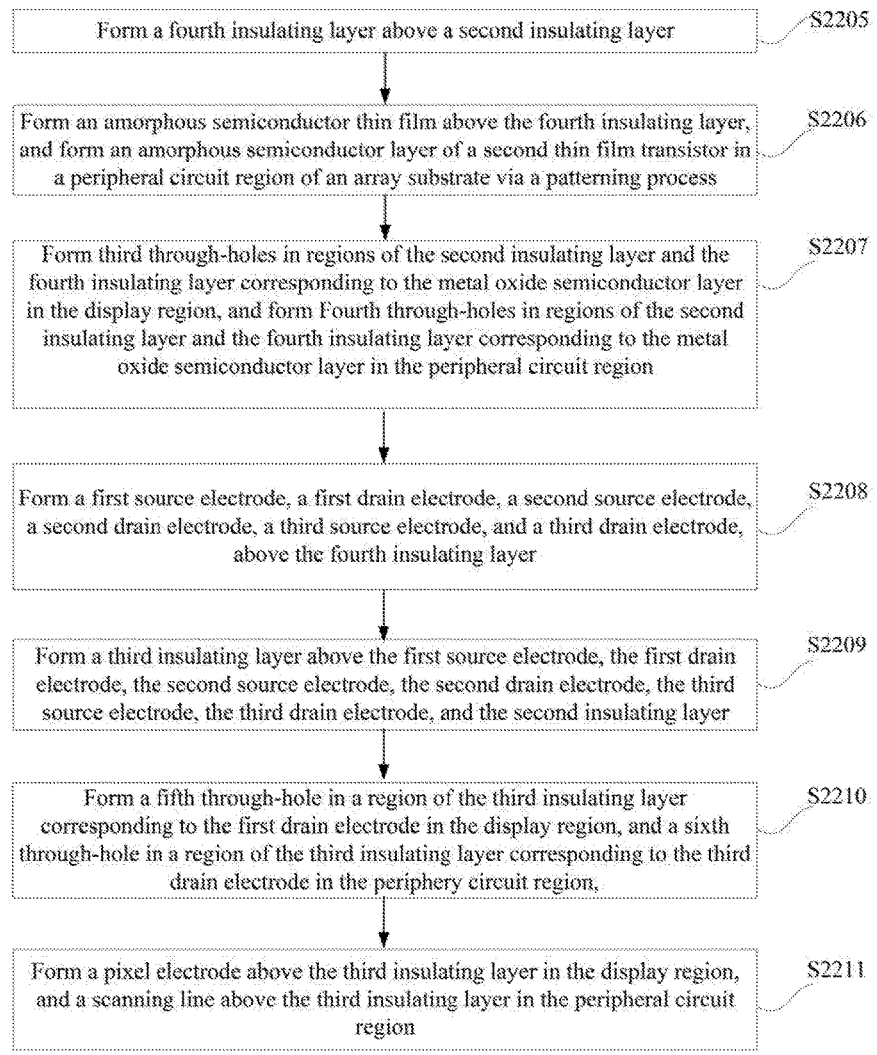
FIG. 22 illustrates a flow chart of Step 2205-Step 2211 in another exemplary array substrate fabrication method according to embodiments of the present disclosure.

In another embodiment, FIG. 22 illustrates a flow chart of Step 2205-Step 2211 in another exemplary array substrate fabrication method according to embodiments of the present disclosure. FIG. 23A-FIG. 23G illustrate cross-sectional views of each step in FIG. 22 according to embodiments of the present disclosure. Based on the aforementioned embodiments, the disclosed fabrication method of an array substrate may include the following steps.

Step S2201: forming a metal oxide semiconductor thin film above a substrate, and forming a metal oxide semiconductor layer of a first thin film transistor in a display region of the array substrate and a metal oxide semiconductor layer of a third thin film transistor in a peripheral circuit region of the array substrate via a patterning process. The metal oxide semiconductor layer of the first thin film transistor in the display region of the array substrate and the metal oxide semiconductor layer of the third thin film transistor in the peripheral circuit region of the array substrate may be formed via the same patterning process.

Step S2202: forming a first insulating layer above the metal oxide semiconductor layer in the display region and peripheral circuit region of the array substrate.

Step S2203: forming a first gate electrode above the first insulting layer in the display region of the array substrate, forming a third gate electrode above the first insulting layer in the peripheral circuit region of the array substrate, and forming a second gate electrode above the substrate in a peripheral circuit region of the array substrate.

Step S2204: forming a second insulating layer on the first gate electrode, the third gate electrode, the second gate electrode, the metal oxide semiconductor layer, and the substrate.

The cross-sectional schematic views in Step S2201-Step S2204 may be similar to the cross-sectional schematic views illustrated in Step S2001-Step S2004, which are not repeatedly provided herein.

Different from the array substrate fabrication method in FIG. 16, the array substrate lubrication method in FIG. 22 may further include the following steps.

Step S2205: forming a fourth insulating layer above the second insulating layer.

Figure 23A:
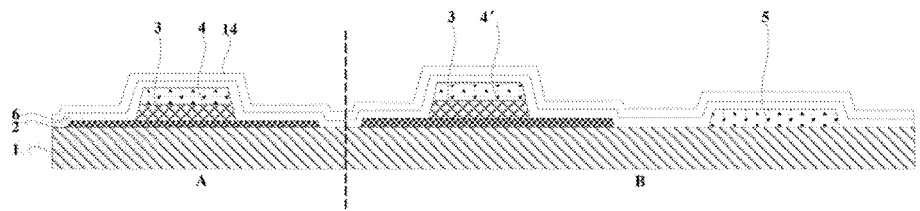
FIG. 23A-FIG. 23G illustrate cross-sectional views of each step in FIG. 22 according to embodiments of the present disclosure.

Referring to FIG. 23A, a fourth insulating layer 14 may be disposed above the second insulating layer 6. A material of the fourth insulating layer may be $SiN_x$. In one embodiment, the fourth insulating layer 14 may be formed by plasma enhanced chemical vapor deposition, and a fabrication temperature may be lower than or equal to 300° C.

Step S2206: forming an amorphous silicon semiconductor thin film above the fourth insulating layer, and forming an amorphous silicon semiconductor layer of a second thin film transistor in the peripheral circuit region of the array substrate via a patterning process.

Figure 23B:
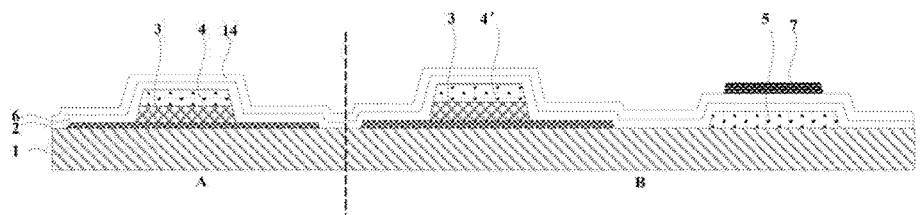

Referring to FIG. 23B, an amorphous silicon semiconductor thin film 7 may be disposed above the fourth insulating layer 14. Via a patterning process, an amorphous silicon semiconductor layer 7 of a second thin film transistor may be formed in the peripheral circuit region B of the array substrate. In one embodiment, the amorphous silicon semiconductor thin film may be formed by plasma enhanced chemical vapor deposition, and the fabrication temperature may be lower than or equal to 300° C.

For example, the amorphous silicon semiconductor thin film 7 and the fourth insulating layer 14 may be formed in the same chamber, such that the change of the fabrication chamber and the transmission of the sample may be avoided. Further, the fabrication process of the array substrate may be effectively simplified, and the fabrication period may be shortened, thereby improving the fabrication efficiency of the array substrate.

Step S2207: forming third through-holes in a region of the second Insulating layer corresponding to the metal oxide semiconductor layer and the fourth insulating layer in the display region of the army substrate, and forming fourth through-holes in a region of the second insulating layer corresponding to the metal oxide semiconductor layer and the fourth insulating layer in the peripheral circuit region of the array substrate.

Figure 23C:
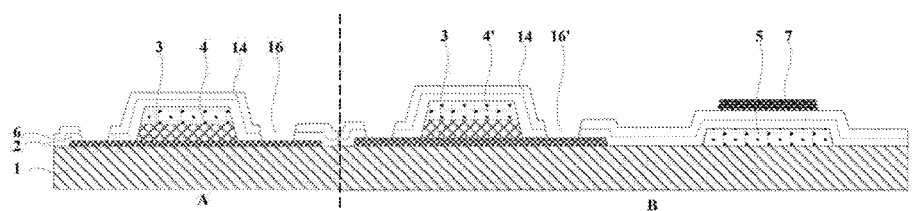

Referring to FIG. 23C, third through-holes 16 may be formed in the region of the second insulating layer 6 and the fourth insulating layer 14 corresponding to the metal oxide semiconductor layer 2 in the display region A of the array substrate, and fourth through-holes 16' may be formed in the region of the second insulating layer 6 corresponding to the metal oxide semiconductor layer 2 and the fourth insulating layer 14 in the peripheral circuit region B of the array substrate. In one embodiment, the third through-holes 16 and the fourth through-holes 16' may be formed by using a mask plate via a photo-etching method.

Step S2208, forming a first source electrode, a first drain electrode, a second source electrode, a second drain electrode, a third source electrode, and a third drain electrode above the fourth insulating layer. The first source electrode and the first drain electrode are connected to the metal oxide semiconductor layer in the display region of the array substrate via the third through-holes, the third source electrode and the third drain electrode are connected to the metal oxide semiconductor layer in the peripheral circuit region of the array substrate via the fourth through-holes, and the second source electrode and the second drain electrode are connected to the amorphous silicon semiconductor layer.

Figure 23D:
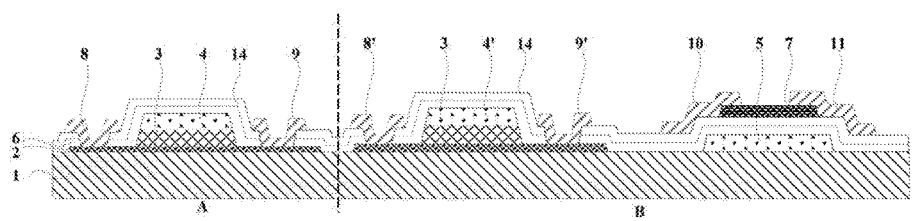
Figure 23E:
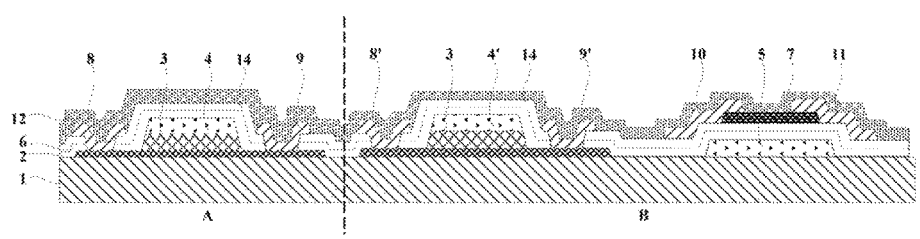

Referring to FIG. 23D, a first source electrode 8, a first drain electrode 9, a third source electrode 8', a third drain electrode 9', a second source electrode 10, and a second drain electrode 11 may be disposed above the fourth insulating layer 14. In particular, the first source electrode 8 and the first drain electrode 9 may be connected to the metal oxide semiconductor layer 2 in the display region A of the array substrate via the third through-holes, the third source electrode 8' and the third drain electrode 9' may be connected to the metal oxide semiconductor layer in the peripheral circuit region B of the array substrate via the fourth through-holes, and the second source electrode 10 and the second drain electrode it maybe connected to the amorphous silicon semiconductor layer 7.

Step S2209, forming a third insulating layer above the first source electrode, the first drain electrode, the second source electrode, the second drain electrode, the third source electrode, the third drain electrode, and the second insulating layer.

Figure 23F:
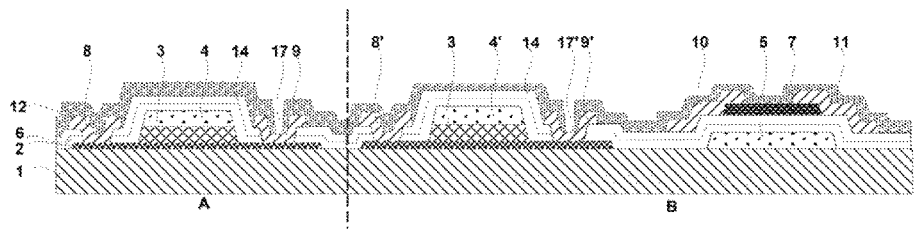

Referring to FIG. 23F, a third insulating layer 12 may be disposed above the first source electrode 8, the first drain electrode 9, the third source electrode 8', the third drain electrode 9', the second source electrode 10, the second drain electrode 11, and the second insulating layer 6. The third insulating layer 12 may be, for example, made of $SiO_2$ or $SiN_x$, or a stacking structure made of $SiO_2$ and $SiN_x$. In one embodiment, the third insulating layer 12 may be formed via a plasma enhanced chemical vapor deposition method, and the fabrication temperature may be configured to be lower than or equal to 300° C.

Step S2210: forming a fifth through-hole in a region of the third insulating layer corresponding to the first drain electrode in the display region of the array substrate, and forming a sixth through-hole in a region of the third insulating layer corresponding to the third drain electrode in the periphery circuit region of the array substrate.

Referring to FIG. 23F, a fifth through-hole 17 may be formed in a region of the third insulating layer 12 corresponding to the first drain electrode 9 in the display region A of the array substrate, and a sixth through-hole 17' may be formed in a region of the third insulating layer 12 corresponding to the first drain electrode 9 in the periphery circuit, region B of the array substrate. In one embodiment, the fifth through-hole 17 and the sixth through-hole 17' may be formed using a mask plate via a photo-etching method.

Step S2210: forming a pixel electrode above the third insulating layer in the display region of the array substrate, and a scanning line above the third insulating layer in periphery circuit region of the array substrate. The pixel electrode is connected to the first drain electrode via the fifth through-hole, and the scanning line is connected to the third drain electrode via the sixth through-hole.

Figure 23G:
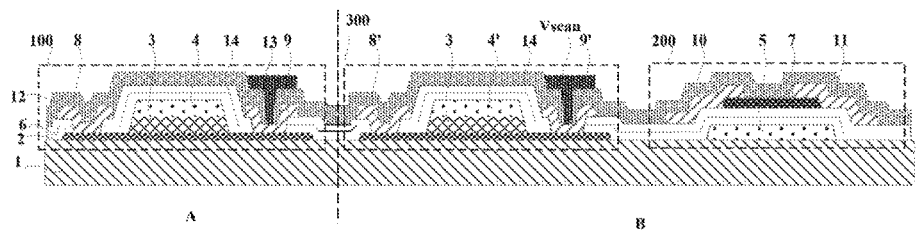

Referring to FIG. 23G, a pixel electrode 13 may be disposed above the third insulating layer 12 in the display region A of the array substrate, and a scanning line $V_{scan}$ may be disposed above the third insulating layer in periphery circuit region B of the array substrate. The pixel electrode 13 may be connected to the first drain electrode 9 via the fifth through-hole, and the scanning line $V_{scan}$ may be connected to the third drain electrode 9' via the sixth through-hole.

In one embodiment, before a metal oxide semiconductor thin, film is disposed above the substrate 1, a buffer layer may be disposed above the substrate 1, and the metal oxide semiconductor thin film 2 and the second gate electrode 5 may be disposed above the buffer layer. The buffer layer may improve the film quality of the metal oxide semiconductor layer 2 and the second gate electrode 5. For example, the buffer layer may be formed by stacking of a $SiO_2$ thin film and a $SiN_x$ thin film. In particular, the $SiN_x$ thin film may be configured to contact the metal oxide semiconductor layer 2.

In the disclosed embodiments shown in FIGS. 11-23, the third thin film transistor 300 (i.e., metal oxide thin film transistor) disposed in the peripheral circuit region B of the array substrate may have a top-gate substrate, which is for illustrative purposes and is not intended to limit the scope of the present disclosure. In another embodiments, the third thin film transistor 300 (i.e., metal oxide thin film transistor) disposed in the peripheral circuit region B of the array substrate may have a bottom-gate substrate. In another embodiments, certain third thin film transistors 300 (i.e., metal oxide thin film transistors) disposed in the peripheral circuit region B of the array substrate may have a top-gate substrate, and certain other third thin film transistors 300 (i.e., metal oxide thin film transistors) disposed in the peripheral circuit region B of the array substrate may have a bottom-gate substrate.

In the disclosed embodiments, the array substrate may comprise a first thin film transistor including a metal oxide thin film transistor, a second thin film transistor including an amorphous silicon thin film transistor, and a third thin film transistor including a metal oxide thin film transistor. The first thin film transistor, the second thin film transistor and the third thin film transistor may be disposed above a substrate, the first thin film transistor may be disposed in a display region of the array substrate, and the second thin film transistor and the third thin film transistor may be disposed in a peripheral circuit region of the array substrate.

The first thin film transistor includes a first metal oxide semiconductor layer, a first gate electrode, a first source electrode and a first drain electrode. The second thin film transistor includes an amorphous silicon semiconductor layer, a second gate electrode, a second source electrode and a second drain electrode. The third thin film transistor includes a second metal oxide semiconductor layer, a third gate electrode, a third source electrode and a third drain electrode. A first insulating layer is disposed between the first metal oxide semiconductor layer and the first gate electrode, and disposed between the second metal oxide semiconductor layer and the third gate electrode. A second insulating layer is disposed above the first gate electrode, the second gate electrode, the third gate electrode, the first metal oxide semiconductor layer, the second metal oxide semiconductor layer, and the substrate. The amorphous silicon semiconductor layer, the first source electrode, the first drain electrode, the second source electrode, the second drain electrode, the third source electrode, and the third drain electrode are disposed above the second insulating layer.

In the disclosed embodiments, on one hand, through disposing the metal oxide thin film transistor in the display region of the array substrate and disposing the amorphous silicon thin film transistor in the peripheral-circuit region of the array substrate, the present disclosure may solve issues that the metal oxide thin film transistor cannot satisfy requirements of the display panel regarding the positive bias stability and the threshold voltage. Thus, the image display effect may be improved, and the stability and yield of the peripheral circuit region may be improved.

On the other hand, by disposing the metal oxide thin film transistor and the amorphous silicon thin film transistor in the peripheral circuit region of the array substrate, i.e., by configuring the shift register in the VSR to include at least one pull-up transistor which is a metal oxide thin film transistor and at least one pull-down transistor which is an amorphous silicon thin film transistor, the area occupied by the vertical shift register (VSR) may be reduced, a narrow border design of the display panel may be facilitated, and the stability of vertical shift register (VSR) may be improved.

It should be noted that, the above detailed descriptions illustrate only preferred embodiments of the present disclosure and technologies and principles applied herein. Those skilled in the art can understand that the present disclosure is not limited to the specific embodiments described herein, and numerous significant alterations, modifications and alternatives may be devised by those skilled in the art without departing from the scope of the present disclosure. Thus, although the present disclosure has been illustrated in above-described embodiments in details, the present disclosure is not limited to the above embodiments. Any equivalent or modification thereof, without departing from the spirit and principle of the present invention, falls within the true scope of the present invention, and the scope of the present disclosure is defined by the appended claims.

What is claimed is:

1. An array substrate, comprising:
   a first thin film transistor including a first metal oxide thin, film transistor and disposed in a display region of the array substrate, wherein the first thin film transistor includes a first metal oxide semiconductor layer, a first gate electrode, a first source electrode and a first drain electrode;
   a second this film transistor including an amorphous silicon thin film transistor and disposed In a peripheral circuit region of the array substrate, wherein the second thin film transistor includes an amorphous silicon semiconductor layer, a second gate electrode, a second source electrode and a second drain electrode; and
   a third thin film transistor including a second metal oxide thin film transistor and disposed in the peripheral circuit region of the array substrate,
   wherein:
   the first thin film transistor, the second thin film transistor and the third thin film transistor are disposed above a substrate, a first insulating layer is disposed between the first metal oxide semiconductor layer and the first gate electrode, a second insulating layer is disposed above the first gate electrode, the second gate electrode, the first metal oxide semiconductor layer, and the substrate, and the amorphous silicon semiconductor layer, the first source electrode, the first drain electrode, the second source electrode, and the second drain electrode are disposed above the second insulating layer.

2. The array substrate according to claim 1, wherein:

the third thin film transistor includes a second metal oxide semiconductor layer, a third gate electrode, a third source electrode and a third drain electrode, the first insulating layer is disposed between the second metal oxide semiconductor layer and the third gate electrode, the second insulating layer is disposed above the third gate electrode and the second metal oxide semiconductor layer, and the third source electrode and the third drain electrode are disposed above the second insulating layer.

3. The array substrate according to claim 2, wherein;

the peripheral circuit region of the array substrate includes a vertical shift register (VSR), the VSR includes N number of cascaded shift registers, where N is a positive integer larger than 1, and a shift register of the N number of cascaded shift registers includes at least one pull-up transistor which is the third thin film transistor and at least one pull-down transistor which is the second thin film transistor.

4. The array substrate according to claim 3, wherein;

an $n^{th}$ stage shift register of the N number cascaded shift registers comprises:

a first transistor having a second electrode connected to a junction P, and a gate electrode connected to an output terminal of an $(n-1)^{th}$ shift register of the N number cascaded shift registers;

a second transistor having a first electrode connected to the junction P, and a gate electrode connected to an output terminal of an $(n+1)^{th}$ shift register of the M number cascaded shift registers;

a third transistor having a first electrode connected to the junction P, a gate electrode connected to a junction Q, and a second electrode connected to a low voltage signal;

a fourth transistor having a gate electrode connected to the junction P, a first electrode connected to a junction Q, and a second electrode connected to the low voltage signal;

a fifth transistor having a gate electrode connected to the junction P, and a first electrode connected to an output terminal of the $n^{th}$ stage shift register of the M number cascaded shift registers;

a sixth transistor having a gate electrode connected, to the junction P, a first electrode connected to the output terminal, of the $n^{th}$ stage shift, register, and a second electrode connected to the low voltage signal;

a seventh transistor having a first electrode connected to the output terminal of the $n^{th}$ stage shift register, and a second electrode connected to the low voltage signal;

a first capacitor having a first plate connected to a junction Q and a second plate connected to the output terminal of the $n^{th}$ stage shift, register; and a second capacitor having a first plate connected to the junction P, wherein the fifth transistor is the at least one pull-up transistor, and n is a positive integer smaller than or equal to N.

5. The array substrate according to claim 2, further comprising:

first through-holes formed in a region of the second insulating layer corresponding to the first metal oxide semiconductor layer, wherein the first source electrode and the first drain electrode are connected to the first metal oxide semiconductor layer via the first through-holes, respectively, and the second source and the second drain electrode are connected to the amorphous silicon semiconductor layer;

second through-holes formed in a region of the second insulating layer corresponding to the second metal oxide semiconductor layer, wherein the third source electrode and the third drain, electrode are connected to the second metal oxide semiconductor layer via the second through-holes, respectively;

a third insulating layer disposed above the first source electrode, the first drain electrode, the second source electrode, the second drain electrode, the third source electrode, the third drain electrode, and the second insulating layer;

a third through-hole formed in a region in the third insulating layer corresponding to first drain electrode;

a fourth through-hole formed in a region in the third insulating layer corresponding to third drain electrode;

a pixel electrode disposed above the third insulating layer, wherein the pixel electrode is connected to the first drain electrode via the third through-hole; and a scanning line disposed above the third, insulating layer, wherein the scanning line is connected to the third drain electrode via the fourth through-hole.

6. The array substrate according to claim 5, further comprising:

a fourth insulating layer disposed on the second insulating layer, wherein the fourth insulating layer and the amorphous silicon semiconductor layer are formed in a same chamber.

7. The array substrate according to claim 6, wherein a material of the second insulating layer is $SiO_2$, and a material of the fourth insulating layer is $SiN_x$.

8. The array substrate according to claim 5, wherein a material of the first insulating layer is $SiO_2$, and a material of the third insulating layer is at least one of $SiO_2$ and $SiN_x$.

9. The array substrate according to claim 2, further comprising:

a buffer layer, wherein the buffer layer is disposed between the first metal oxide semiconductor layer and the substrate, between the second metal oxide semiconductor layer and the substrate, and between the second gate electrode and the substrate.

10. The array substrate according to claim 1, wherein a material of the second insulating layer is $SiO_2$ or $SiN_x$.

11. The array substrate according to claim 1, wherein:

an active layer of the first metal oxide thin film transistor and an active layer of the second metal oxide thin film transistor each includes a metal oxide comprising one or a plurality of Zn, Ga, In, Sn, Al, Hf C, B, N, and S.

12. The array substrate according to claim 1, wherein:

the display region of the array substrate includes a plurality of pixel driving circuits, and a pixel driving circuit includes at least two first thin film transistors and at least one capacitor.

13. A display panel comprising an army substrate, wherein the array substrate includes:

a first thin film transistor including a first metal oxide thin film transistor and disposed in a display region of the array substrate, wherein the first thin film transistor includes a first metal oxide semiconductor layer, a first gate electrode, a first source electrode and a first drain electrode;

a second thin film transistor including an amorphous silicon thin film transistor and disposed in a peripheral circuit region of the array substrate, wherein the second thin film transistor includes an amorphous silicon semiconductor layer, a second gate electrode, a second source electrode and a second drain electrode; and a third thin film transistor including a second metal oxide thin film transistor and disposed in the peripheral circuit region of the array substrate, wherein the first thin film transistor, the second thin film transistor and the third thin film transistor are disposed above a substrate, a first insulating layer is disposed between the first metal oxide semiconductor layer and the first gate electrode, a second insulating layer is disposed above the first gate electrode, the second gate electrode, the first metal oxide semiconductor layer, and the substrate, and the amorphous silicon semiconductor layer, the first source electrode, the first drain electrode, the second source electrode, and the second drain electrode are disposed above the second insulating layer.

14. An array substrate fabrication method, comprising:

forming a first thin film transistor, a second thin film transistor and a third thin film transistor above a substrate, wherein both the first thin film transistor and the third thin film transistor are metal oxide thin film transistors, and the second thin film transistor is an amorphous silicon thin film transistor, the first thin film transistor is disposed in a display region of the array substrate, and both the second thin film transistor and the third thin film transistor are disposed in a peripheral circuit region of the array substrate.

15. The array substrate fabrication method according to claim 14, wherein forming the first thin film transistor, the second thin film transistor and the third thin film transistor above the substrate further comprises:

forming a metal oxide semiconductor thin film above the substrate, and via a patterning process, forming a first metal oxide semiconductor layer of the first thin film transistor in the display region of the array substrate and a second metal oxide semiconductor layer of the third thin film transistor in the peripheral circuit region of the array substrate;

forming a first insulating layer above the first metal oxide semiconductor layer and the second metal oxide semiconductor layer;

forming a first gate electrode of the first thin film transistor above the first insulting layer of the display region in the array substrate, forming a second gate electrode of the second thin film transistor above the substrate in the peripheral circuit region of the array substrate, and forming a third gate electrode of the third thin film transistor above the first insulting layer of the peripheral circuit region in the array substrate;

forming a second insulating layer on the first gate electrode, the second gale electrode, the third gate electrode, the first metal oxide semiconductor layer, the second metal oxide semiconductor layer and the substrate;

forming an amorphous silicon semiconductor thin film above the second insulating layer, and forming an amorphous silicon semiconductor layer of the second thin film transistor in the peripheral circuit region of the array substrate via a patterning process;

forming first through-holes in a region of the second insulating layer corresponding to the first metal oxide semiconductor layer, and forming-second through-holes in a region of the second insulating layer corresponding to the second metal oxide semiconductor layer;

forming a first source electrode and a first drain electrode of the first thin film transistor, a second source electrode and a second drain electrode of the second thin film transistor, and a third source electrode and a third drain electrode of the third thin film transistor above the second insulating layer, wherein the first source electrode and the first drain electrode are connected to the first metal oxide semiconductor layer via the first through-holes, respectively, the second source electrode and the second drain electrode are connected to the amorphous silicon semiconductor layer, and the third source electrode and the third drain electrode are connected to the second metal oxide semiconductor layer via the second through-holes, respectively;

forming a third insulating layer above the first source electrode, the first drain electrode, the second source electrode, the second drain electrode, the third source electrode, the third drain electrode and the second insulating layer;

forming a third through-hole in a region of the third, insulating layer corresponding to the first drain electrode, and forming a fourth through-hole in a region of the third insulating layer corresponding to the third drain electrode; and forming a pixel electrode and a scanning line above the third insulating layer, wherein the pixel electrode is connected to the first drain electrode via the third through-hole, and the scanning line is connected to the third drain electrode via the fourth through-hole.

16. The method according to claim 15, wherein:

the amorphous silicon semiconductor thin film and the third insulating layer are formed by a plasma enhanced chemical vapor deposition method, and a fabrication temperature of the amorphous silicon semiconductor thin film and the third insulating layer is lower than or equal to 300° C.

17. The method according to claim 15, wherein;

the first insulating layer is formed by a plasma enhanced chemical vapor deposition method, and a lubrication temperature of the first insulating layer is lower than or equal to 220° C.

18. The array substrate fabrication method according to claim 14, wherein forming the first thin film transistor, the second thin film transistor and the third thin film transistor above the substrate further comprises;

forming a metal oxide semiconductor thin film above the substrate, and via a patterning process, forming a first metal oxide semiconductor layer of the first thin film transistor in the display region of the array substrate and a second metal oxide semiconductor layer of the third thin film transistor in the peripheral circuit region of the array substrate;

forming a first insulating layer above the first metal oxide semiconductor layer and the second metal oxide semiconductor layer;

forming a first gate electrode of the first thin film transistor above the first insulting layer of the display region in the array substrate forming a second gate electrode of the second thin film transistor above the substrate in the peripheral circuit region of the array substrate, and forming a third gate electrode of the third thin film transistor above the first insulting layer of the peripheral circuit region in the array substrate;

forming a second insulating layer on the first gate electrode, the second gate electrode, the third gate electrode, the first metal oxide semiconductor layer, the second metal oxide semiconductor layer and the substrate;

forming a fourth insulating layer above the second insulating layer;

forming an amorphous silicon semiconductor thin film above the fourth insulating layer, and forming an amorphous silicon semiconductor layer of the second thin film transistor in the peripheral circuit region of the array substrate via a patterning process;

forming first through-holes in regions of the second insulating layer and the fourth insulating layer corresponding to the first metal oxide semiconductor layer, and forming second through-holes in regions of the second insulating layer and the fourth insulating layer corresponding to the second metal oxide semiconductor layer;

forming a first source electrode and a first drain electrode of the first thin film transistor, a second source electrode and a second drain electrode of the second thin film transistor, and a third source electrode and a third drain electrode of the third thin film transistor above the fourth insulating layer, wherein the first source electrode and the first drain electrode are connected to the first metal oxide semiconductor layer via the first through-holes, respectively, the second-source electrode and the second drain electrode are connected to the amorphous silicon semiconductor layer, and the third source, electrode and the third drain electrode are connected to the second metal, oxide semiconductor layer via the second through-holes, respectively;

forming a third insulating layer above the first source electrode, the first drain electrode, the second source electrode, the second drain electrode, the third source electrode, the third drain electrode and the second insulating layer;

forming a third through-hole in a region of the third insulating layer corresponding to the first drain electrode, and forming a fourth through-hole in a region of the third insulating layer corresponding to the third drain electrode; and forming a pixel electrode and a scanning line above the third insulating layer, wherein the pixel electrode is connected to the first drain electrode via the third through-hole, and the scanning line is connected to the third drain electrode via the fourth through-hole.

19. The method according to claim 18, wherein;
the second insulating layer is formed by a plasma enhanced chemical vapor deposition method, and a fabrication temperature is lower than or equal to 220° C., and
the fourth insulating layer is formed by a plasma enhanced chemical vapor deposition method, and a fabrication temperature of the second insulating layer is lower than or equal to 300° C.

20. The method according to claim 18, wherein the fourth insulating layer and the amorphous silicon semiconductor layer are formed continuously in a same chamber.

* * * * *